(12) United States Patent
Neuhaus et al.

(10) Patent No.: US 6,853,087 B2
(45) Date of Patent: Feb. 8, 2005

(54) COMPONENT AND ANTENNAE ASSEMBLY IN RADIO FREQUENCY IDENTIFICATION DEVICES

(75) Inventors: Herbert J. Neuhaus, Colorado Springs, CO (US); Michael E. Wernle, Hohenkirchen (DE); Frederick A. Blum, Colorado Springs, CO (US); Michael Kober, Glonn (DE)

(73) Assignee: Nanopierce Technologies, Inc., Denver, CO (US)

( * ) Notice: Subject to any disclaimer, the term of this patent is extended or adjusted under 35 U.S.C. 154(b) by 0 days.

(21) Appl. No.: 09/957,401

(22) Filed: Sep. 19, 2001

(65) Prior Publication Data

US 2002/0053735 A1 May 9, 2002

Related U.S. Application Data

(63) Continuation-in-part of application No. 09/812,140, filed on Mar. 19, 2001, which is a continuation of application No. 09/684,238, filed on Oct. 5, 2000, application No. 09/957,401, which is a continuation-in-part of application No. 09/883,012, filed on Jun. 15, 2001.
(60) Provisional application No. 60/233,561, filed on Sep. 19, 2000.

(51) Int. Cl.$^7$ .......................... H01L 23/48; H01L 29/40
(52) U.S. Cl. ................. 257/778; 257/779; 257/784; 257/786; 257/777; 257/738; 257/737; 257/700; 257/701; 257/758
(58) Field of Search .................. 257/778, 779, 257/784, 786, 787, 738, 737, 734, 700, 701, 758

(56) References Cited

U.S. PATENT DOCUMENTS

| | | | |
|---|---|---|---|
| 3,100,933 A | 8/1963 | Hancock et al. | 228/116 |
| 3,203,083 A | 8/1965 | Obenhaus | 228/115 |

(List continued on next page.)

FOREIGN PATENT DOCUMENTS

| | | |
|---|---|---|
| DE | 0154652 | 4/1982 |
| GB | 2158757 | 11/1985 |
| JP | 54-17359 | 2/1979 |
| JP | 63-49382 | 3/1988 |
| JP | 63-264283 | 11/1988 |
| JP | 64-87087 | 3/1989 |
| SU | 893469 | 5/1982 |
| SU | 1333511 | 8/1987 |
| SU | 1447611 | 12/1988 |

OTHER PUBLICATIONS

Hogerton et al., "Investigations Into the Use of Adhesives for Level–1 Microelectonic Interconnections", 3M/I&E Sector Labs. 3M Center, prior to Feb. 1990, pp–1–10.

(List continued on next page.)

*Primary Examiner*—Alexander Oscar Williams
(74) *Attorney, Agent, or Firm*—Dorsey & Whitney LLP

(57) ABSTRACT

Permanent physical and electrical attachment of electrically conductive contacts of a first component in a RFID device, such as a smart card or smart inlay, is made to the electrically conductive contacts of a second component of the device, for example, a conductive area, such as an antenna. Attachment is achieved by co-depositing metal and electrically conductive hard particles upon the conductive contacts of either the first or second components and then using a non-conductive adhesive to provide permanent bond between the components and their conductive contacts.

45 Claims, 15 Drawing Sheets

U.S. PATENT DOCUMENTS

| | | | |
|---|---|---|---|
| 3,330,982 A | 7/1967 | Dickson, Jr. | 324/754 |
| 3,482,726 A | 12/1969 | Schroeder, Jr. | 228/115 |
| 3,555,664 A | 1/1971 | Bingham et al. | 228/115 |
| 3,596,027 A | 7/1971 | Okutomi et al. | 200/266 |
| 3,632,319 A | 1/1972 | Hoppin et al. | 29/487 |
| 3,700,427 A | 10/1972 | Hoppin, III et al. | 75/5 R |
| 3,701,021 A | 10/1972 | Isaac et al. | 324/754 |
| 3,921,885 A | 11/1975 | Knox | 228/116 |
| 4,233,103 A | 11/1980 | Shaheen | 156/331 |
| 4,398,975 A | 8/1983 | Ohsawa et al. | 148/400 |
| 4,485,153 A | 11/1984 | Janikowski et al. | 428/688 |
| 4,606,778 A | 8/1986 | Jahnke | 148/11.5 N |
| 4,695,707 A | 9/1987 | Young | 219/392 |
| 4,926,118 A | 5/1990 | O'Connor et al. | 324/158 F |
| 5,001,829 A | 3/1991 | Schelhorn | 29/840 |
| 5,007,842 A | 4/1991 | Deak et al. | 439/66 |
| 5,010,249 A | 4/1991 | Nishikawa | 250/306 |
| 5,012,187 A | 4/1991 | Littlebury | 324/158 P |
| 5,037,312 A | 8/1991 | Casciotti et al. | 439/66 |
| 5,061,191 A | 10/1991 | Casciotti et al. | 439/66 |
| 5,100,338 A | 3/1992 | Lu | 439/326 |
| 5,163,837 A | 11/1992 | Rowlette, Sr. | 439/91 |
| 5,173,055 A | 12/1992 | Grabbe | 439/66 |
| 5,180,523 A | 1/1993 | Durand et al. | 252/512 |
| 5,226,226 A | 7/1993 | Fierkens | 29/827 |
| 5,288,430 A | 2/1994 | Amemiya | 252/512 |
| 5,302,891 A | 4/1994 | Wood et al. | 324/754 |
| 5,336,096 A | 8/1994 | Ozawa et al. | 439/72 |
| 5,402,077 A | 3/1995 | Agahdel et al. | 324/758 |
| 5,475,317 A | 12/1995 | Smith | 324/754 |
| 5,492,266 A | 2/1996 | Hoebener et al. | 228/248.1 |
| 5,493,075 A | 2/1996 | Chong et al. | 174/261 |
| 5,551,627 A | 9/1996 | Leicht et al. | 228/180.22 |
| 5,616,520 A | 4/1997 | Nishiuma et al. | 438/125 |
| 5,741,430 A | 4/1998 | Dahringer et al. | 216/34 |
| 5,762,259 A | 6/1998 | Hubacher et al. | 228/180.22 |
| 5,834,335 A | 11/1998 | Buschborn | 438/107 |
| 5,874,043 A | 2/1999 | Sarkhel et al. | 420/557 |
| 5,913,110 A | 6/1999 | Herbst | 438/126 |
| 5,921,856 A | 7/1999 | Zimmer | 451/539 |
| 5,953,210 A | 9/1999 | Lo | 361/704 |
| 5,980,722 A | 11/1999 | Kuroda et al. | 205/219 |
| 6,051,489 A | 4/2000 | Young et al. | 438/612 |
| 6,084,172 A | 7/2000 | Kishi et al. | 136/200 |
| 6,156,390 A | 12/2000 | Henry et al. | 427/122 |
| 6,166,432 A | 12/2000 | Ohno et al. | 257/701 |
| 6,183,874 B1 | 2/2001 | Yamagata et al. | 428/472 |
| 6,189,208 B1 | 2/2001 | Estes et al. | 29/840 |
| 6,250,127 B1 | 6/2001 | Polese et al. | 72/251.6 |
| 6,395,124 B1 | 5/2002 | Oxman et al. | 257/778 |
| 6,404,476 B1 | 6/2002 | Mase | 174/882 |
| 6,410,415 B1 | 6/2002 | Estes et al. | 257/778 |
| 2002/0027294 A1 | 3/2002 | Neuhaus et al. | 257/778 |

OTHER PUBLICATIONS

Haufler et al., "Diffusion Bonding of Cast and Eb–Welding of PM Nickel–Base Superalloys", *High Temperature Alloys for Gas Turbines and Other Applications 1986*, Proceedings of a Conference held in Liege, Belgium, Oct., 1996, D. Reidel Publishing Company, pp–801–810.

Whalley et al., "Anisotropic Conducting Adhesives for Electronic Assembly", Microelectronics International 16/2, 1999, pp. 44–48.

Komukai et al., "An Approach to the Anisotropic Conductive Adhesives for Micro–Interconnection Technology", Technical Paper Technology Information, Oct. 1996.

John Wiley & Sons, Kirk–Othmer Encyclopedia of Chemical Technology, Third Edition, vol. 1, "Abrasives", pp 26–52, 1978.

COMPONENT AND ANTENNAE ASSEMBLY IN RADIO FREQUENCY IDENTIFICATION DEVICES

CROSS-REFERENCE TO RELATED APPLICATIONS

This application is related to and claims the benefit of priority of the following applications. This application is a continuation-in-part of U.S. patent application Ser. No. 09/812,140 entitled "Electrical Component Assembly and Method of Fabrication," filed Mar. 19, 2001, which application is a continuation of U.S. patent application Ser. No. 09/684,238 entitled "Electrical Component Assembly and Method of Fabrication," filed Oct. 5, 2000. This application is also a continuation in part of U.S. patent application Ser. No. 09/883,012 entitled "Electroless Process for the Preparation of Particle-Enhanced Electric Contact Surfaces," filed Jun. 15, 2001. This application also claims the benefit of priority of U.S. provisional application Ser. No. 60/233,561 entitled "Manufacturing of Low Cost Smart Labels," filed Sep. 19, 2000. This application is further related to U.S. provisional application Ser. No. 60/220,027 entitled "Advances in Materials for Low Cost Flip-Chip," filed Jul. 21, 2000. Each of these related applications is hereby incorporated herein in its entirety by reference.

FIELD OF THE INVENTION

The invention relates broadly to methods and configurations for electrical and mechanical connection of semiconductor radio frequency transceiver chips to antenna structures and particularly to radio frequency identification device assemblies and methods for fabrication thereof.

BACKGROUND OF THE INVENTION

A radio frequency identification device ("RFID") by definition is an automatic identification and data capture system comprising readers and tags. Data is transferred using electric fields or modulated inductive or radiating electromagnetic carriers. RFID devices are becoming more prevalent in such configurations as, for example, smart cards, smart labels, security badges, and live stock tags.

Typically, a smart card is a flexible, credit card size, plastic device embedded with a chip that provides memory, microprocessing capability, and RF transmission and reception (a "transceiver"). When employed with a "reader," operating power is supplied to the chip and the reader communicates with the chip to read and, in some applications, write information to the chip. As is well known, all of these integrated circuit devices, or "chips," are manufactured in mass quantities on silicon "wafers." The wafers are cut into multiple "die," each of which is a discrete, individual chip. Many of these terms (e.g., die, chip, microprocessor) are used interchangeably in the art. In this application, the term "chip" is used hereinafter to refer to any form of discrete or integrated circuit device, either active or passive, and electro-optic devices.

In their initial applications conventional smart cards (sometimes known as "chip cards") contained a "chip module" embedded in a credit card sized piece of plastic. A chip module is a chip that is "packaged" with, or pre-connected to, a substrate (a "chip carrier"), usually prepared with contact areas and conducting tracks, to allow for easier handling and connection of the chip within a circuit assembly. The cards could be "read" by being plugged into a reader so that pins in the reader physically touched a "contact plate," i.e., an exposed contact area of the chip module. The contact plate contained a number of conductors that communicated with the reader via the pins. These "contact" smart cards were more versatile than "swipe" cards, which contain a limited amount of information, such as, a customer account number, in a magnetic strip on one side of the card. On the other hand, these early smart cards were still limited by the need to physically contact or insert the card into a reader, thereby slowing down the speed with which transactions could be completed.

Several things have greatly expanded the potential applications for smart cards. Among these is the continued development of processing capability and memory storage capacity associated with ever smaller chips. This has enabled smart cards to be employed in new ways that require larger amounts of data storage or processing capability. In addition, new "contactless" smart cards have been developed that do not require physical contact of the smart card with the reader. These contactless smart cards employ technology similar to that of RFID cards, which have been used for a number of years in security or access control situations. These RFID cards are usually hard, rigid, flat devices that contain a chip and an antenna. The RFID cards are powered by radio frequency ("RF") energy generated by a reader that energizes a circuit within the RFID card and enables the exchange of a limited amount of information between the RF reader and the chip in the card.

Typically, the new contactless smart cards are the same size as a credit card and work like an RFID card. However, the ability of a smart card to store vast amounts of information with great security has spurred its use in a number of applications. Smart cards were initially employed commercially as "phone cards," storing a prepaid dollar amount in memory for authorizing telephone usage, particularly at public telephones. Communications between the telephone and the card authorize or deny usage of the telephone and deduct the amount of the telephone charges from the available amount maintained in memory. Smart cards are now employed as electronic debit/credit cards, as "loyalty" cards, and for accessing and utilizing pay-television and mass transit facilities. They are also being deployed as electronic tickets for exhibitions and events, for the storage of and ready access to individual health/medical records, and for vehicle anti-theft systems. New uses are being created regularly.

The transfer of information by RF has expanded the possible applications for smart cards by eliminating the need for physical contact of a contact plate of a smart card with a reader. The addition of a miniature antenna (for example, a coil or dipole) in the card body enables the contactless card to communicate via RF waves, thereby permitting a greater range of operation, e.g., about one meter utilizing current commercial technology. Further technological improvements are expected to significantly increase the operating range of these contactless smart cards. Eliminating the need for contact between the smart card and the reader reduces the time that it takes the reader to access and communicate with the smart card, making smart cards more acceptable to users. Improved reader accessibility to the cards reduces queuing time, making smart cards much more user friendly, for example, in situations where numerous people need to pass rapidly through a limited number of access points (e.g., gates to mass transit systems and event facilities).

Another new development is a hybrid, or "dual-interface," smart card that contains both a contact plate and an antenna and can be energized and accessed by either a contact reader or RF reader. Both interface capabilities are therefore resident in a single smart card. Unless otherwise indicated, as used hereinafter, the term "smart card" encompasses traditional smart cards, contactless smart cards, and dual-interface smart cards.

Generally, smart cards are utilized by individuals and retained and secured by them, for example in a wallet or purse, in the same manner as a credit card. Alternatively, a smart card may be worn by the user like an identification badge. Smart cards may also be employed as a "tag" to monitor, for example, the movement of books, clothing, or other retail products, or even livestock or wild animals.

Technological improvements have enabled RFID devices to be employed in increasingly smaller and thinner forms, for example, as labels on inanimate objects or for verification of legal documents. These small, thin, flexible RFID components are hereinafter termed "smart inlays." Smart inlays are typically the size of a postage stamp and generally comprise a programmable integrated circuit chip connected to an antenna on a substrate. Although a smart inlay might be read by contact with a scanner, its primary purpose is to provide a label containing information which can be transferred without the need for time-consuming, individualized scanning, for example, optical scanning of one- or two-dimensional bar codes.

One form of use for a smart inlay is in a "smart label." Smart labels typically comprise a thin laminate of paper or plastic enveloping a smart inlay, which enables communication through RF signals over considerable distances, e.g., one meter or more. Accordingly, smart labels attached, for example, to overnight courier packages or airline baggage, or used as retail labels, or for rental services (e.g., library books and videos). Smart labels need not be individually manipulated relative to a scanner, but may transfer information in the normal course of handling the package, for example, while placing the package on a conveyor or loading the package onto a cart or truck as the package passes a fixed reader. In addition, and unlike a bar coded label with fixed information, the data stored in the chip memory of the smart label can be modified by transmitting updated data from a reader without the need to replace the label. The paper or plastic laminate of the smart label containing the smart inlay may be printed with identification, or even corresponding optical bar codes, similar to regular packaging labels.

Another form of smart inlay use is in the creation of "smart paper." Smart paper is a paper document that contains a smart inlay, usually for authenticity or verification purposes—like an electronic watermark. Examples of documents that may use a smart label are personal identification, stock certificates, bonds, wills, and other legal documents where proof of authenticity is desirable.

In typical uses, smart inlays are also inductively powered by the RF field emanating from the reader and do not need a battery. Because smart cards and smart inlays are powered electrically by the reader, they may be classified, in one sense, as "passive" devices. Although it is technically possible for these devices to contain their own internal sources of power, these power sources are prohibitively expensive at the present time. As used herein, however, the terms "smart card" and "smart inlay" are intended to include both passive devices and internally powered devices. The terms "smart card" and "smart inlay" also are intended to include both disposable (e.g., single use) and reuseable and/or reprogrammable RFID devices. Contactless and dual-interface smart cards and smart inlay devices all may be collectively referred to as "flexible transponders" in that they are small electronic circuits attached to or contained within a flexible physical carrier (such as plastic) and capable of receiving, transmitting, and storing data over RF waves (for example, by amplitude or frequency modulation) in a frequency range of approximately 100 kHz and 2.54 Ghz, depending on system design.

Because of the increasing recognition of possible fields of use, smart cards and smart inlays are being produced in ever increasing quantities. It is estimated that approximately two billion smart cards were produced world-wide during the year 2000 and some forecasts predict nearly six billion in the year 2003. Typically, the issuance of smart cards or smart inlays devices is an added business cost for the issuer not directly covered by the user. For example, issuance of smart cards for use on public transit facilities is usually not offset by higher fares to the users of those cards compared to other transit users. While the use of smart cards might encourage additional ridership and provide additional revenue, the issuance of cards is an added cost to the carrier. For this reason and others discussed herein, there is a significant need to find new ways to produce these increasing quantities of smart cards and smart inlays efficiently and cost effectively with improved manufacturing techniques.

Even with the advantages smart cards and smart inlays offer, product reliability is essential to marketplace acceptance and use. Dysfunctional smart cards and smart inlays result in considerable annoyance and dissatisfaction—both for consumers who rely on them and card/label issuers—and deter expansion of the "smart" technology into additional applications. Most smart cards and smart inlays are dynamically flexed, i.e., they are subject to flexion, in normal use. Although there are other applications, e.g., personal computers and automobiles, where computer circuits are flexed on a single occasion, i.e., during installation, they are not subjected to repeated flexing in normal use. Thus, the chips, antenna, and any other circuits and electronic components in smart cards and smart inlays are subjected to mechanical stresses not encountered by typical computer circuitry including these prior art "flex circuits." Similarly, prior art RFID cards were designed to be hard and rigid to prevent flexion and thereby damage to the chip and circuit when used. As yet there has been no successful precedent to assist manufacturers in the production of massive quantities smart cards or smart inlays that are highly reliable. Thus, there is a great need to provide a system and methodology for forming inexpensive and reliable connections in smart cards and smart inlays in a high production environment.

Flexion of smart cards and smart inlays subject the chips and other miniaturized electronic components and circuits contained in them to considerable physical stress even with normal handling. Those forces can result in loss of electrical contact between components and inoperability of the smart card or smart inlay. The connection between a chip module and antenna in a contactless smart card or chip to antenna in a smart inlay is particularly vulnerable in normal use. Accordingly, any improved method for manufacturing smart cards and smart inlays must provide connectivity between electrical components that can withstand the physical abuse inherent with those products. However, current technologies for the connecting a chip or chip module to a substrate or antenna structure are still wasteful and painfully slow.

For example, in order to electrically connect a chip to a module at the contact areas of the module there exist two major techniques: wire bonding and flip-chip die bonding. Wire bonding is a process where a very thin metal wire is used to connect the chip bond pads to the contact lands on the module. A representative prior art process for fabricating a smart card using wire bonding of the chip module is shown in prior art FIGS. 1A–1E. Chip 100 is generally composed of silicon die 102 with multiple bond pads 104 as shown in prior art FIG. 1A. Chip 100 contains the necessary programming and data appropriate for the purpose of controlling the smart card. A chip carrier 105 for receiving chip 100 is shown in prior art FIG. 1B. Chip carrier 105 is composed of a distribution layer of contact lands 112 and conductive tracks (not shown), usually of copper; a substrate 106, generally of a glass epoxy; and contact plates 108, for example, of copper plated with nickel and gold, on the opposite side of substrate 106 from contact lands 112. The substrate 106 is formed with vias 110, or passages from one side of the substrate 106 to the other. These vias 110 are lined with the conductive walls 113 that extend through the vias 110 to make electrical contact with contact plates 108 on the opposite side of substrate 106.

The chip 100 is attached to the chip carrier 105 electrically by wire bonds 114 the form a chip module 115 as shown in prior art FIG. 1C. Typically a bonder will automatically bond one end of a wire to a bond pad 104 on the silicon die 102 and bond the opposite end of the wire either to contact lands 112 or through a via in the chip carrier substrate 106 (as shown) to form connection between the chip 100 and the contact plates 108 on the opposite side of the chip carrier 105. The electrical connections between the wire bond 114 and the chip 100 and the chip carrier 105, respectively, are formed through ultrasonic or thermal-sonic welding. A major disadvantage of this process is that each chip 100 needs to be connected through multiple wire bonds 114 with the chip carrier 105. This makes the chip attach process to the chip carrier 105 very time consuming and costly. Another disadvantage is that wire bonding also consumes up to 10 times the area of the chip 100, thus limiting the ability of this connection method to keep pace with the demand for miniaturization. Thermal-sonic welding of the wire bonds 114 creates high temperatures necessitating the selection of a chip carrier substrate 106 that can withstand such temperatures.

In order to mechanically connect the chip 100 to the chip carrier 105, the chip is generally glued to the substrate using a chip-attach adhesive (not shown). The chip 100 and the wire bonds 114 are then coated with an encapsulant 116. The encapsulant 116 further secures the chip 100 to the chip carrier 105 and protects the wire bonds 114 from mechanical and environmental damage. Encapsulant coating is another time consuming step in the module 115 assembly process, as the encapsulant 116 must cure before the module 115 can be handled further.

A dual-interface smart card blank 125 as shown in prior art FIG. 1D is composed of the card body 118 with a cavity 120 for receiving the chip module 115. The cavity 120 is further formed with a shelf 122 for supporting the edges of the chip module 115. The card body 118 further envelops antenna windings 128 that reside beneath the surface of the card body 118. The antenna 128 normally consists of several concentric loops or windings (depicted in the side view of FIG. 1, and as element 1228 in FIG. 12b) to provide adequate reception and transmission capability. The antenna 128 and card body 118 are typically prepared on a base by silver-paste printing and laminating. For example, the antenna 128 can be prepared by a silver-paste screen printing process with a cylinder screen-printing machine on an inner-layer sheet, typically PVC or similar material. Although not depicted in the drawing, the PVC and antenna can then be laminated together with graphically designed core-sheets and overlay-sheets with a thermo-transfer press.

Normally the card blank 125 with antenna 128 is manufactured in multi-card sheets. After lamination, the sheets are punched into single cards and then the cavity 120 for the chip module 115 is milled. Additional antenna cavities 123 extend below the shelf 122 to provide access to antenna contacts 128a and 128b for electrical connection to the chip module 115. The antenna cavities 123 are prepared by using special drilling tools to expose the antenna contacts 128a and 128b, as the depth has to be adjusted very carefully and precisely to reach the printed silver-paste track-ends. This type of antenna 128 is typically used for the 13.56 MHz Mifare system (available from Philips Semiconductors, Eindhoven, The Netherlands). The coil consists of 4 to 5 "windings," with a total resistance after lamination of about 2 to 6 ohms.

FIG. 1D further shows the typical prior art preparation of a smart card body 118 for receipt of and electrical and mechanical connection with the chip module 115. Conductive adhesive 126 is dispensed in the antenna cavities 123 to provide the necessary electrical contact between the antenna contacts 128a and 128b and the contact lands 112 on the chip module 115. The conductive adhesive 126 connecting the contact lands 112 to the antenna contacts 128a and 128b may be a silver filled epoxy paste (e.g., EPO-TEK E4110 from Epoxy Technology Corp., represented by POLYTEC GmbH, D-76337 Waldbronn, Polytec-Platz 1–7). The chip 100 is thereby electrically connected both to antenna 128, which permits RF communication with an external device, and to contact plates 108 by way of the distribution tracks 113 in vias 110 that connect the contact lands 112 to the contact plates 108, which permits a physical electronic interface between the chip 100 and a card reader through the contact plates 108. In either case, the power for the chip 100 is supplied by the card reader or external RF device.

Additionally, nonconductive adhesive 124 is applied to the shelf 122 within the cavity 120 in order to mechanically secure the chip module 115 to the smart card body 118. The separate nonconductive adhesive 124 is used to hold the chip module 115 within the card body as it is less expensive and has better adhesive qualities than conductive adhesive 126. Using non-conductive adhesive 124 also prevents unwanted electrical connections across contact lands 112. However, care must also be taken in applying the non-conductive adhesive so that it does not cover or interfere with the electrical contact between the contact lands 112 and the antenna contacts 128a and 128b.

Cyanoacrylate liquid adhesives are generally used as the nonconductive adhesive 124 in less expensive smart cards; in more critical smart card applications a double-sided, heat-curable, adhesive tape (e.g., TESA 8410 from Beiersdorf AG located at D-20245 Hamburg, Unnastrasse 48) is usually used. Normally this double-sided, heat-curable, non-conductive adhesive is first applied to the inner side of the chip module 115 with a hot-press. Then the chip module 115 is inserted into the cavity 120 and bonded to the card body 118 with the applied non-conductive adhesive 124 by heat and pressure. For the best adhesion and lifetime of this assembly, the cavity 120 should be treated before bonding the chip module 115 by a plasma (e.g., Plasma-System 4003 from Technics Plasma GmbH located at D-85551 Kirchheim bei München, Dieselstrsse 22a). Such a plasma treatment leads to very clean surfaces with a certain roughness and, therefore, allows a very durable bonding of the chip module 115 into the cavity 120 of the card body 118. A fully assembled prior art dual-interface smart card 130 is depicted in FIG. 1E.

In addition to the problems with wire bonds 114, the assembly of prior art smart cards using conductive adhesives results in even more disadvantages. The electrical characteristics of conductive adhesives change over a periods of seconds, minutes, and hours during curing. In practice this means that the completed smart cards cannot be tested immediately after assembly. With production rates measured in thousands of units per hour, any delay in testing can result in substantial yield losses in defective cards before a defect in the manufacturing process is detected. Productivity is also adversely impacted because cards must be stockpiled before testing can be completed. Accordingly, it is highly desirable to develop manufacturing processes in which the cards and labels can be tested immediately.

Among the other current chip bonding technologies used in RFID manufacturing, the most common chip-to-antenna connection processes include either flip-chip to chip carrier soldering, or flip-chip bonding with an anisotropic conductive adhesive of the chip to the chip carrier, and then a chip module to antenna connection utilizing conductive adhesive. For chip attachment, the most widely used process is traditional soldering technology, as modified for direct chip mounting. Often eutectic Pb/Sn solders for the bumping and connection process such as Pb/Sn 37/63 are used. Although it is widely used, the disadvantages are great. Due to relatively high temperatures of the soldering process, the selection of the substrate materials is limited to extremely high grade, high cost materials—not exactly a favorable condition for mass quantity, and in some cases disposable, mobile electronics products, especially paper or polypropylene substrates desired for smart inlays. In addition, recent changes in legislation addressing environmental and health concerns in the European Union, Japan, and the U.S. prescribe the use of lead-free soldering materials, which usually require a considerably higher processing temperatures or more expensive solders. Also, the preparation of a solderable metalization surface on the substrate before soldering, and a cleaning step after bonding, are necessary, which undoubtedly increase the complexity and the cost of the process. There is often additionally the requirement of underfilling the chip in this process, which is an added, time-consuming and cost incrementing step.

Flip chip bonding with anisotropic conductive adhesives (ACA) is another chip to chip carrier bonding method which is gaining more attention recently. ACAs can provide electrical as well as mechanical interconnections between chips and chip carriers, as well as modules to antenna coil pads. The conductivity of the ACA is restricted to the Z-direction while maintaining electrical isolation within the X-Y plane. In addition, the ACA materials act as an encapsulant and seal the underface of the flip. This eliminates the need for an additional underfill step. However, ACA is often up to 10 times more expensive than nonconductive adhesive. Further, surfaces often require chemical treatment before the ACA is applied in order to achieve adequate bond strength. Moreover, the mating surfaces, i.e., the chip bond pad, the antenna contact, and chip carrier contact land, have to be deoxided. The placement of the chip must be very accurate and only very limited tolerance is acceptable. Other disadvantages are high pressure requirements during the pick and place process, which can damage the chip, especially the thin chips used in smart cards and particularly smart inlays, and a highly sophisticated placement process for the expensive ACA materials (tape or film).

Flip-chip bonding with isotropic conductive adhesive is another influential chip bonding technique. The process generally lends itself well to integration into a production line. Yet there are clear limits with respect to cost, especially for small components and pitch distances since the electrical connection is provided by isotropically conductive adhesive, i.e., it will conduct in any direction and therefore must be placed discretely at individual bond sites. The high precision requirements therefore, significantly increase the cost of this technology. In this process, bumps are also added to the bond pads of the chips. These are generally nickel/gold bumps or stud bumps. In addition, high temperatures and a long curing process are usually required. Another notable disadvantage of either chip bonding technique using conductive adhesives, either isotropic or anisotropic, is that immediate testability is often impossible because of the long curing time required.

As a result of these factors, standard dual-interface smart cards and other RFID devices are currently manufactured using a combination of non-conductive adhesive (for holding parts together generally) and conductive adhesives (for forming an electrical connection at the contact lands or bond pads). Nevertheless, this compromise does not avoid the disadvantages previously noted. Accordingly, there is a significant need for improved manufacturing processes that can attach the components of smart cards and smart inlays, both cheaply and effectively.

SUMMARY OF THE INVENTION

The present invention provides a new method for physically and electrically attaching the electrically conductive contacts of a first component in a RFID device, such as a smart card or smart inlay, to the electrically conductive contacts of a second component of the device. Components of an RFID device may include, for example, a memory chip, a programmable logic array, a microprocessor chip, a transceiver, or other discrete or integrated circuit device, a chip carrier, a chip module, and a conductive area, e.g., an antenna. Conventionally, when such an attachment, for example, attachment of a chip to an antenna structure, is to be made, methods such as wirebonding, soldering, flip-chip with conductive adhesive bonding, as discussed above, are often used. For these conventional methods, the use of high temperatures, expensive materials, or expensive high precision machinery is often a necessity which dramatically increases the manufacturing cost for the RFID device.

A new method is developed in this invention for creating the aforementioned attachments. In a first embodiment for attaching a chip to an antenna structure, a particle-enhanced surface is created by either electrolytically or electrolessly co-depositing metal and electrically conductive hard particles on the chip bond pads. The chip is then picked, placed, and bonded to the antenna structure to make the permanent physical connection by non-conductive adhesive. The electrical connection is made through the penetration of metal-plated hard particles on the chip bond pads into the mating surface on the antenna structure. The conductive hard particles should have a hardness at least as great as that of the electrically conductive contacts. A compressive force is used to promote the particle penetration into the antenna contact surfaces, and is maintained until the adhesive sufficiently cures and creates a permanent bond.

The process further includes placing a non-conductive adhesive between the contact surfaces of the first component (for example, chip bond pads) and the second component (for example, antenna contacts); placing the contact surfaces of the first and second components in alignment with one another to form an interface; applying a compressive force to the contact surfaces in a direction generally normal to the interface such that at least a portion of the hard particles penetrate through the adhesive and pierce the second conductive surface to permanently bond them together; and finally curing the adhesive.

As described herein, the application of the particles to the electrically conductive contact surfaces and of the adhesive in the interstice between the contact surfaces can be accomplished in a number of ways. Variations of the inventive method include applying the adhesive to the first or the second contact surfaces, or to both contact surfaces. In another aspect of this invention, a film adhesive is disposed between two surfaces at the time of assembly. The adhesive may be a permanently hardenable adhesive, which hardens before the compressive force is removed.

A process for applying hard particles and conductive metallization on the contact surfaces of an electrical component can be carried out in a multi-stage co-deposition process. The electrical component may be drawn through a metal-particle bath to form a metal-particle layer. The component is then drawn through a second metal bath to form an anchoring layer overlying the particle layer. Additional plating steps can be carried out to form one or more additional particle anchoring layers overlying the deposited hard particles.

The hard particles may be affixed to the desired contact surfaces by, for example, either electrolessly plating or electrolytically plating a thin metal layer over the particles on the first contact surface. When an electroless plating method is used to deposit the particles and metal on at least one of the mating surfaces, a preferred method is disclosed in U.S. patent application Ser. No. 09/883,012 entitled "Electroless Process for the Preparation of Particle-Enhanced Electric Contact Surfaces," filed on Jun. 15, 2001, however, other electroless plating methods may also be used. In the electroless process the particle-enhanced surface can be made by a two-step electroless metal plating method. The first plating step co-deposits hard particles with a metal in an electroless metal bath with the particles in solution. The second plating step overcoats a conductive metal on the co-deposited metal-particle surface to improve the electrical conductivity.

When electrolytic plating method is used to create the particle-enhanced surface, a preferred method is disclosed in U.S. patent application Ser. No. 09/812,140 entitled "Electrical Component Assembly and Method of Fabrication," filed Mar. 19, 2001, however other electrolytic processes may likewise be used. Such a method can be carried out by positioning a substrate under a mesh electrode located within a metal plating bath. Particles within the bath pass through the mesh electrode and settle on the substrate. A metal, such as nickel, is simultaneously deposited over the particles.

A second embodiment for attaching a chip to an antenna structure is the same as that described in the first embodiment, with the exception that the particle-enhancement is applied to the antenna structure, instead of on the chip bond pads. The significant advantage of the first embodiment is that when a chip bond pads are the recipients of the particle-enhancement, the particle co-deposition can take place before the chip is diced from the wafer. In this manner, hundreds or thousands of chips on a wafer may be plated with particles at the same time. There are also several advantages to the second embodiment. First, the particle-enhancement may be performed to all dies on finished or nearly finished wafers without significant cost or impacting the chip yield of the wafer once diced. Second, if the production need is too small to particle-enhance an entire wafer, individual chips can still be enhanced with particles.

Third, economies of scale dictate the component to be particle-enhanced, for example, on either the chip or the chip carrier. However, it does not matter which component receives the particle-enhancement as the assembly of the component remains the same.

A third embodiment of the invention is directed to chip attachment to a chip carrier, wherein generally the same process described in the first embodiment can also be applied. However, in this embodiment, the particle-enhanced chip is bonded to the chip carrier with non-conductive adhesive.

In a fourth embodiment of the invention, also directed to chip attachment to a chip carrier, the same procedure described in the third embodiment can be applied, with the exception that the particle-enhancement is applied to the chip carrier instead of on the chip bond pads. Non-conductive adhesives as mentioned in the previous embodiments may be applied to at least one of the mating surfaces. The bonding can be performed in the same manner as the chip attachment method described in the first embodiment.

In a fifth embodiment, the process of the first embodiment can be applied to attach a chip module to an antenna structure (for instance, to attach a dual-interface chip module to the antenna coil in a contactless smart card), but here the particle-enhancement is applied to the chip carrier. Once the chip is attached to the chip carrier to form the chip module, the chip module is bonded to the antenna structure with non-conductive adhesive in the same manner as described in the first embodiment.

In a sixth embodiment, the process described in the fifth embodiment can be applied, but instead of applying particle-enhancement to the chip carrier, the particle-enhancement is applied to the antenna structure. Then, non-conductive adhesive is used to bond the chip module to the antenna structure.

In summary, the invention comprises methods of placing one or more hard particles on at least one of the respective contacts of mating contact surfaces on first and second components in a RFID device, such as a smart card or smart inlay. The components include, for example, chips, chip carriers, chip modules, and antenna structures. The invention further comprises methods for placing a non-conductive adhesive between the first and second components, no matter which of the mating contact surfaces is particle-enhanced.

The invention also includes an improved method for manufacturing electrical components for smart cards and smart inlays having at least one electrical contact, comprising placing particles on at least one of the contacts, wherein the particles have a hardness at least as great as that of the contact. A layer of electrically conductive metal is placed on the particles and at least a portion of the contact. Again, the particles and the layer of electrically conductive metal may be deposited simultaneously.

The invention also includes improved smart cards and smart inlays containing at least two components having mating electrical contacts, wherein the components are physically and electrically attached to one another by a layer of electrically conductive metal and particles and a layer of non-conductive adhesive. The particles should have a hardness at least as great as that of the electrically conductive contacts.

In yet another aspect of the invention, an electrical component assembly for a smart card or a smart inlay is provided that includes a substrate having a plurality of electrical contact sites on a surface of the substrate. A plurality of hard particles resides on the substrate, such that each of the electrical contact sites has at least one hard particle affixed to the electrical contact site.

Similarly, the production of smart cards and smart inlays can be facilitated in another aspect of the invention wherein an electrical component is enhanced by particles simultaneously with a plurality of other electronic components in an array. Such an array bay be either one or two dimensional. Each of the plurality of electrical components has at least one electrical contact site. In this embodiment, the hard particles are applied to the contact sites, such that at least one hard particle is affixed to each of the electrical contact sites. Finally, the array is divided to singularize the plurality of electrical component assemblies into many individual electrical components, thus producing many electrical components simultaneously in one operation. An adhesive may be applied to the plurality of electrical components either before or after they are singularized from the substrate. The adhesive may also be applied to cover substantially all of the substrate, or if desired, the adhesive may cover only selected portions of the substrate.

The method of the invention is particularly applicable to the contact pad treatment of semiconductor chips where the array is a semiconductor wafer. Additionally, the array may be a flexible circuit tape or a rigid circuit board. Further, the array may be a flexible tape of smart cards or smart inlays. Again, an adhesive material can be applied to at least selected portions of the surface of these electrical components and to the hard particles before subdividing the array. Alternatively, the adhesive material can be applied to at least selected portions of the surface of the electrical components and to the hard particles after subdividing the substrate.

In still a further aspect of the invention, hard particles may be affixed to a printed circuit or electrical component to create a component assembly with hard particles on it. The attachment may be accomplished by co-depositing metal and particles by any of the methods described previously. Alternately, the particles may be fixed by means of the adhesive itself. In another aspect, the hard particles remain unattached to either surface to be joined, and instead, the particles reside in the adhesive. In this embodiment, the entire adhesive surface may contain such particles. In another embodiment, the hard particles are applied to the adhesive in such a manner that they reside only in selected regions of the adhesive. Those selected regions may correspond with the electrical contact sites to be interconnected on the substrate or electrical component.

DETAILED DESCRIPTION OF THE INVENTION

Figure 2:
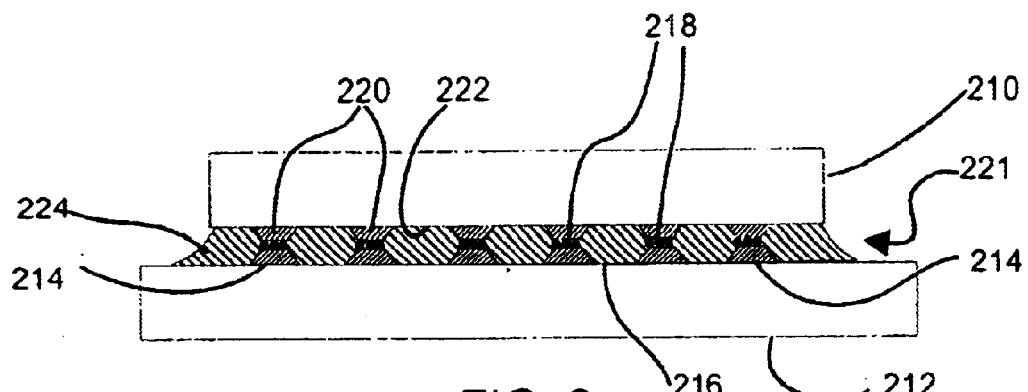
FIG. 2 illustrates, in cross-section, an electrical component assembly arranged in accordance with one embodiment of the present invention.

Shown in FIG. 2 is a generalized, cross-sectional view of an electrical component assembly arranged in accordance with one embodiment of the invention. A substrate 212 may be a chip carrier for a smart card module, an antenna substrate for a smart inlay, or any other substrate for use in a RFID device. An electrical component 210 is mounted on the substrate 212. Electrical component 210 can be one of a number of different electrical components including semiconductor integrated circuit devices, such as, for example, a memory device, a logic device, a microprocessor, and other types of chips. Further, the substrate 212 can be a flex circuit or a chip carrier having one or more chips mounted thereon.

A plurality of electrical contact sites, referred to herein as contact "lands" 214, reside on a bonding surface 216 of the substrate 212 and are arranged to receive corresponding electrically conductive hard particles 218 that, in the present embodiment, are affixed to conductive bonding pads 220 of the electrical component 210. The conductive hard particles 218 employed in this invention and its various embodiments generally have a hardness at least as great, and preferably greater, than the hardness of the electrical contact sites (e.g., contact lands 214). The conductive hard particles 218 may be formed from a metal, for example, copper, aluminum, nickel, tin, bismuth, silver, gold, platinum, palladium, lithium, beryllium, boron, sodium, magnesium, potassium, calcium, gallium, germanium, rubidium, strontium, indium, antimony, cesium, and barium, as well as alloys and intermetallics of these metals. As described later herein, nickel is a preferred metal.

In one embodiment of the invention, the conductive hard particles 218 formed from a nonconductive core particle covered with or surrounded by a layer of conductive metal, such as listed above. In this case, the non-conductive core particles may be non-metallic materials, for example, metal oxides, nitrides, borides, silicon and other carbides, beryllium, boron fibers, carbon fibers, garnet, and diamond. Diamond is a preferred non-metallic hard particle. Nickel and copper are preferred metal coatings for such core particles. Where a thermal conductor is desired, diamond and ceramics are preferred materials. In one embodiment of the invention, hard particles 218 are composed of a diamond core plated with a layer of nickel.

The conductive hard particles 218 may also be covered with a thin layer of gold. Gold provides low contact resistance and prevents oxidation of the contact surface. Alternatives to gold may include platinum, palladium, chrome, palladium-nickel alloy, and tin nickel alloy.

Each of the contact lands 214 is electrically conductive to provide an electrical interconnection between the electrical component 210 and the substrate 212. The bonding pads 220, also electrically conductive, may be arrayed on the surface of a chip and arranged for the flip-chip attachment of the chip to substrate 212. Alternatively, bonding pads 220 can be located on a bonding surface of a chip carrier or a flex circuit populated with one or more electrical components 210. In one embodiment of the invention, bonding pads 220 and contact lands 214 are each metallized with a layer of nickel.

In the electrical component mounting arrangement illustrated in FIG. 2, a gap 221 is formed between the bonding surface 216 of the substrate 212 and a face surface 222 of the electrical component 210. The gap 221 typically varies from about 0.5 to about 5 mils. The gap 221 is completely filled with an adhesive material 224.

In the present invention, a preferred adhesive material 224 is one that sets very rapidly without need for heat or other treatments, for example, cyanoacrylate. Alternatively, adhesive material 224 can be an ultraviolet-light (UV) curable polymer composition. Additionally, other types of adhesives can be used, for example, permanently hardenable adhesives, hot melt adhesives and other thermoplastic adhesives, and polymerizable adhesives. As yet another alternative, adhesive material 224 can be contact and pressure-sensitive adhesives. Preferably, the adhesive material 224 employed should have reduced levels of certain impurities that can adversely affect the electrical component 210 or the interconnection. In particular, sodium and chlorine ions are known to cause chips to fail and promote corrosion of electrical interconnections under humid conditions.

Figure 3:
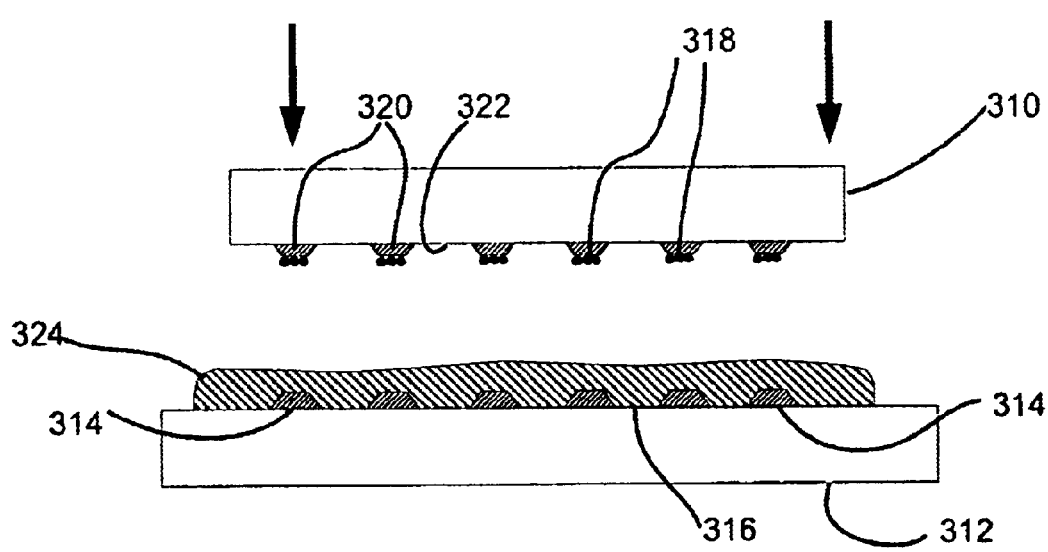
FIG. 3 illustrates, in cross-section, an electrical component and a substrate before assembly, arranged in accordance with a first process embodiment of the invention, in which hard particles are affixed to the electrical component and an adhesive is applied to the substrate.

A number of processes can be employed to implement the present invention in preparing, assembling, and securing electrical components 210 to substrates 212. FIG. 3 illustrates a cross-sectional view of electrical component 310 and substrate 312 before assembly and arranged in accordance with a first process embodiment of the invention. Substrate 312, with separate discrete contact lands 314 thereon, is pre-coated with adhesive material 324 before mounting electrical component 310 to substrate 312. Adhesive material 324 is applied to the substrate 312 as either a liquid or an adhesive tape. Hard particles 318 are affixed to the corresponding bonding pads 320 on face surface 322 of electrical component 310. Adhesive material 324 is uniformly spread across bonding surface 316 of substrate 312, over contact lands 314, and covers the remainder of the substrate 312. Alternatively, adhesive material 324 may be applied to the face surface 322 of the electrical component 310 over the hard particles 318. The electrical component 310 is then positioned so that the bonding pads 320 with affixed hard particles 318 face substrate 312 and align with contact lands 314 of substrate 312.

To mount electrical component 310 to substrate 312, bonding pads 320 with affixed hard particles 318 are moved into intimate contact with contact lands 314, and a compressive force is applied, as indicated by the arrows shown in FIG. 3. Under the compressive force, hard particles 318 pierce into contact lands 314 of substrate 312. Depending upon the particular adhesive material used in the assembly, adhesive material 324 is hardened by either a self-hardening mechanism or by thermal or UV curing of the adhesive, and then the compressive force is released producing the assembly illustrated in FIG. 2. Importantly, hardened adhesive 324 provides a continuous seal between electrical component 310 and substrate 312 and maintains the compressive force between substrate 312 and electrical component 310, such that hard particles 318 remain partially embedded in contact lands 314 after the initially applied compressive force is released.

Figure 4:
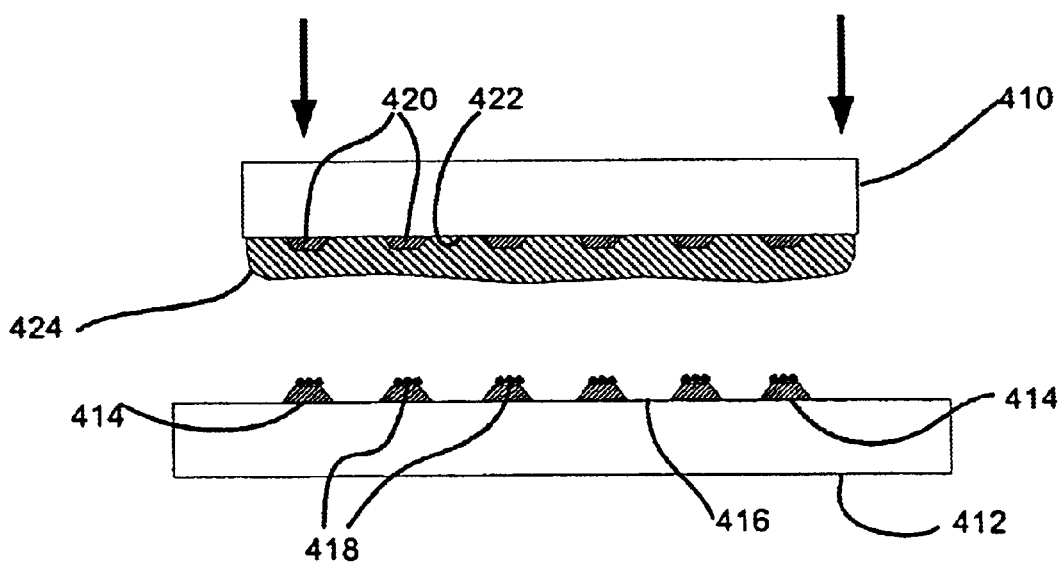
FIG. 4 illustrates, in cross-section, an electrical component and a substrate before assembly, arranged in accordance with a second process embodiment of the invention, in which hard particles are affixed to the substrate and an adhesive is applied to the electrical component.

FIG. 4 illustrates a cross-sectional view of electrical component 410 and substrate 412 before assembly and arranged in accordance with a second process embodiment of the invention. Electrical component 410, with separate discrete bonding pads 420 thereon, is pre-coated with adhesive material 424 before assembly with substrate 412. Similar to the previous process embodiment of FIG. 3, adhesive material 424 is applied to electrical component 410 as either a liquid or an adhesive tape.

In the present embodiment, hard particles 418 are affixed to the corresponding contact lands 414 on bonding surface 416 of substrate 412. Adhesive material 424 is uniformly spread across face surface 422 of electrical component 410, over bonding pads 420, and covers the remainder of face surface 422. Alternatively, adhesive material 424 may be applied to the bonding surface 416 of the substrate 412 over the hard particles 418. The electrical component 410 is then positioned so that bonding pads 420 face substrate 412 and align with contact lands 414 with affixed hard particles 418.

Next, bonding pads 420 are moved into intimate contact with contact lands 414 and a compressive force is applied, as indicated by the arrows shown in FIG. 4. Under the compressive force, hard particles 418 pierce into the bonding pads 420 of electrical component 410. Adhesive material 424 is hardened as previously described, and then the compressive force is released producing the assembly illustrated in FIG. 2. As in the previous embodiment, hardened adhesive 424 provides a continuous seal between the component 410 and the substrate 412. Hardened adhesive material 424 maintains the compressive force between substrate 412 and electrical component 410, such that hard particles 418 remain partially embedded in bonding pads 420 after the initially applied compressive force is released.

Figure 5:
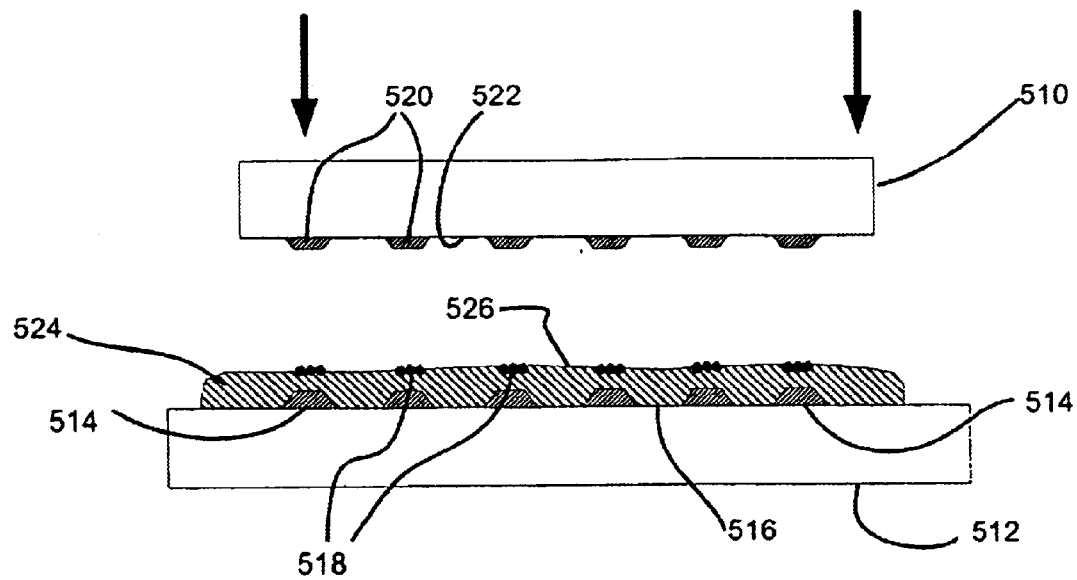
FIG. 5 illustrates, in cross-section, an electrical component and a substrate before assembly, arranged in accordance with a third process embodiment of the invention, in which hard particles are affixed to an adhesive disposed on the substrate.

FIG. 5 illustrates a cross-sectional view of electrical component 510 and substrate 512 before assembly and arranged in accordance with a third process embodiment of the invention. Substrate 512, with separate discrete contact lands 514 thereon, is pre-coated with adhesive material 524 before assembly with component 510. As in the first process embodiment described above with respect to FIG. 3, adhesive material 524 is applied to substrate 512 as a liquid adhesive, a solid film adhesive, or an adhesive tape. Adhesive material 524 is uniformly applied across bonding surface 516 of substrate 512 and over contact lands 514.

In the present embodiment, hard particles 518 are affixed to a surface 526 of adhesive material 524 and are directly and selectively positioned in relationship to corresponding contact lands 514 on bonding surface 516 of substrate 512. Hard particles 518 can be selectively positioned on surface 526 by, for example, selectively spraying a particle slurry, or by applying a stencil to surface 526 and applying a particle slurry to the stencil. Once hard particles 518 are applied to surface 526, electrical component 510 is positioned so that bonding pads 520 face substrate 512 and align with contact lands 514. Hard particles 518 reside on the surface of adhesive material 524 directly between contact lands 514 and bonding pads 520.

To mount electrical component 510 to substrate 512, bonding pads 520 are moved into intimate contact with hard particles 518 and contact lands 514, and compressive force is applied, as previously described. Under the compressive force, hard particles 518 pierce into adhesive material 524 and contact lands 514 of substrate 512, and simultaneously pierce bonding pads 520 of electrical component 510. The adhesive 524 is hardened as previously described and then the compressive force is released, producing the assembly illustrated in FIG. 2.

Figure 6:
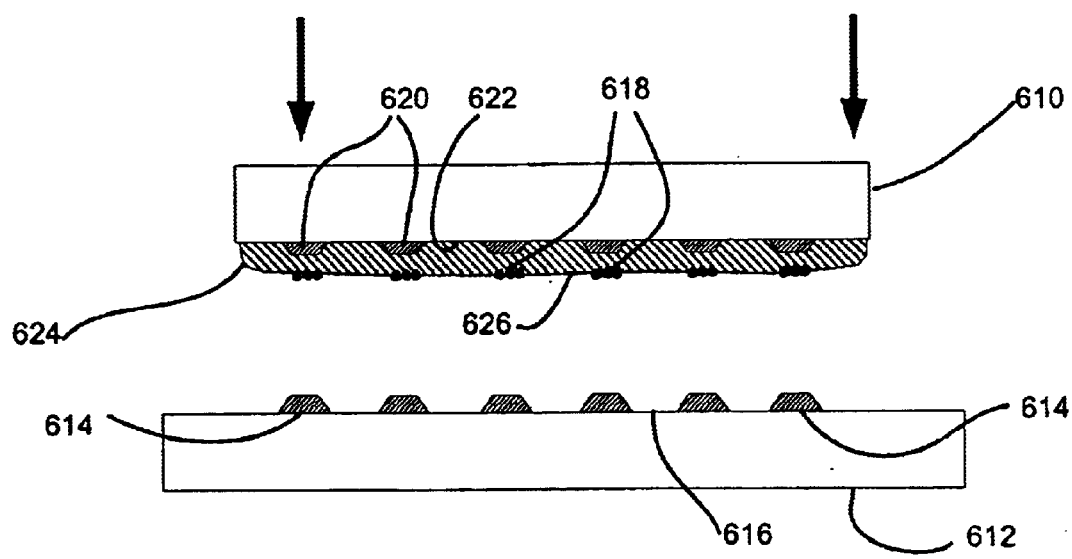
FIG. 6 illustrates, in cross-section, an electrical component and a substrate before assembly, arranged in accordance with a fourth process embodiment of the invention, in which hard particles are affixed to an adhesive disposed on the electrical component.

FIG. 6 illustrates a cross-sectional view of electrical component 610 and substrate 612 before assembly and arranged in accordance with a fourth process embodiment of the invention. Electrical component 610, with separate discrete bonding pads 620 thereon, is pre-coated with adhesive material 624 before assembly with substrate 612. As in the second process embodiment described above shown in FIG. 4, adhesive material 624 is applied to electrical component 610 as a liquid adhesive, a solid film adhesive, or an adhesive tape. Adhesive material 624 is uniformly applied across face surface 622 of electrical component 610, over bonding pads 620, and covers the remainder of the electrical component 610.

In the present embodiment, hard particles 618 are affixed to surface 626 of adhesive material 624 directly and selectively in relationship to corresponding bonding pads 620 on face surface 622 of component 610. Electrical component 610 is then positioned so that bonding pads 620 face substrate 612 and align with contact lands 614. Bonding pads 520 with overlying adhesive material 624 and hard particles 618 are moved into intimate contact with contact lands 614, and compressive force is applied, as indicated by the arrows shown in FIG. 6. Under the compressive force, hard particles 618 pierce into adhesive material 624 and bonding pads 620 of component 610, and simultaneously pierce contact lands 614 of substrate 612. Adhesive material 624 is hardened as previously described and the compressive force is released, producing the assembly illustrated in FIG. 2.

Figure 7A:
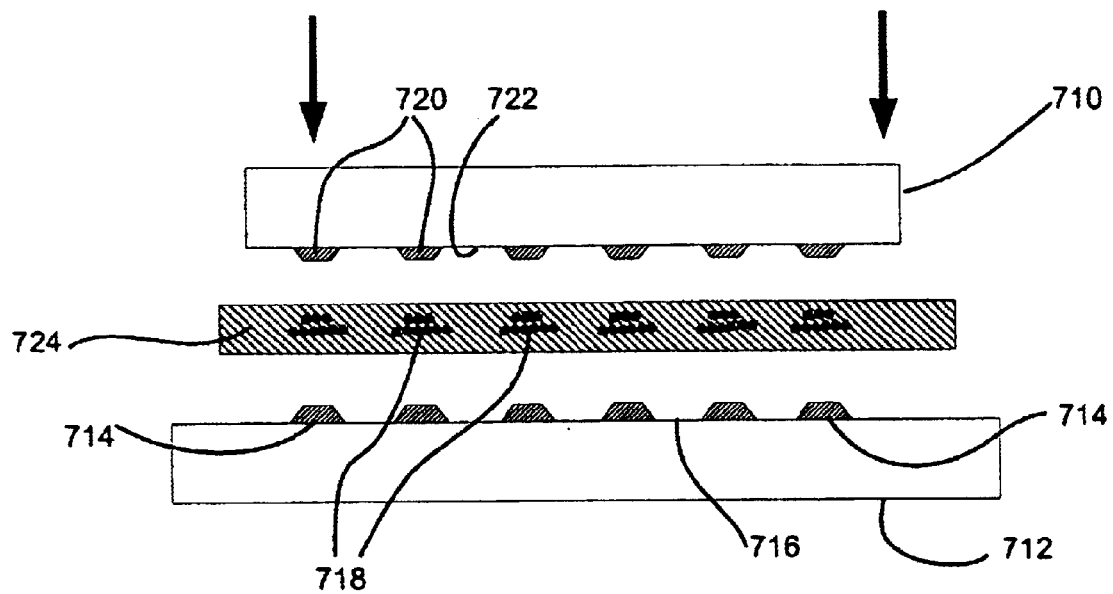
FIGS. 7A and 7B illustrate, in cross-section, a substrate and an electrical component undergoing an attachment method in accordance with a fifth process embodiment of the invention, in which selected portions of an adhesive contain hard particles in an aligned relationship with the contact sites on the substrate and the electrical component.
Figure 7B:
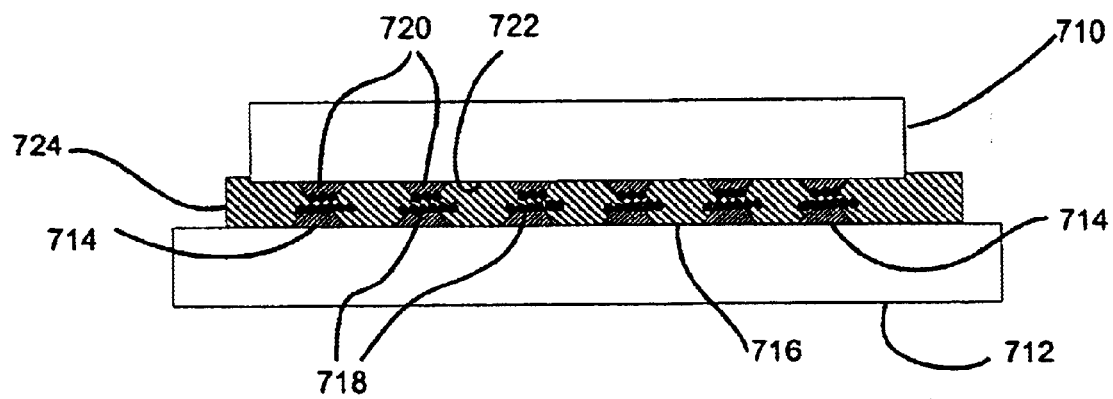

FIGS. 7A and 7B illustrate cross-sectional views of substrate 712 and electrical component 710 undergoing an attachment method in accordance with a fifth process embodiment of the invention. In the present embodiment, adhesive material 724 exists on its own as self-supporting film before mounting electrical component 710 to substrate 712. Adhesive material 724 may be either a solid material or an adhesive tape.

Hard particles 718 may be affixed within adhesive material 724 directly and selectively, such that when adhesive material 724 is positioned between electrical component 710 and substrate 712, hard particles 718 are positioned in relationship with corresponding bonding pads 720. Hard particles 718 may be positioned within adhesive material 724 by, for example, forming a first layer of adhesive, then, affixing the hard particles 718 by spraying a slurry or a stencilling as described above. After affixing hard particles 718, a second layer of adhesive may be formed to overlie the particles and first layer of adhesive. Multiple layers of hard particles 718 are shown suspended in adhesive material 724 in FIGS. 7A and 7B. However, single layers of hard particles 718 affixed within the adhesive material 724 and positioned corresponding to each bonding pad 720 are sufficient.

Electrical component 710, substrate 712, and adhesive material 724 are then positioned so that bonding pads 720 face substrate 712, and such that hard particles 718, suspended in adhesive material 624, also align with contact lands 714 of substrate 712. Adhesive material 724 with suspended hard particles 718 is positioned between electrical component 710 and substrate 712. Then, bonding pads 720 are moved into intimate contact with adhesive material 724 and contact lands 714, and compressive force is applied, as previously described. Under the compressive force, hard particles 718 simultaneously pierce through adhesive material 724 into bonding pads 720 of electrical component 710 and into contact lands 714 of substrate 712. Adhesive material 724 is hardened as previously described, and then the compressive force is released, producing the assembly illustrated in FIG. 7B.

Figure 8A:
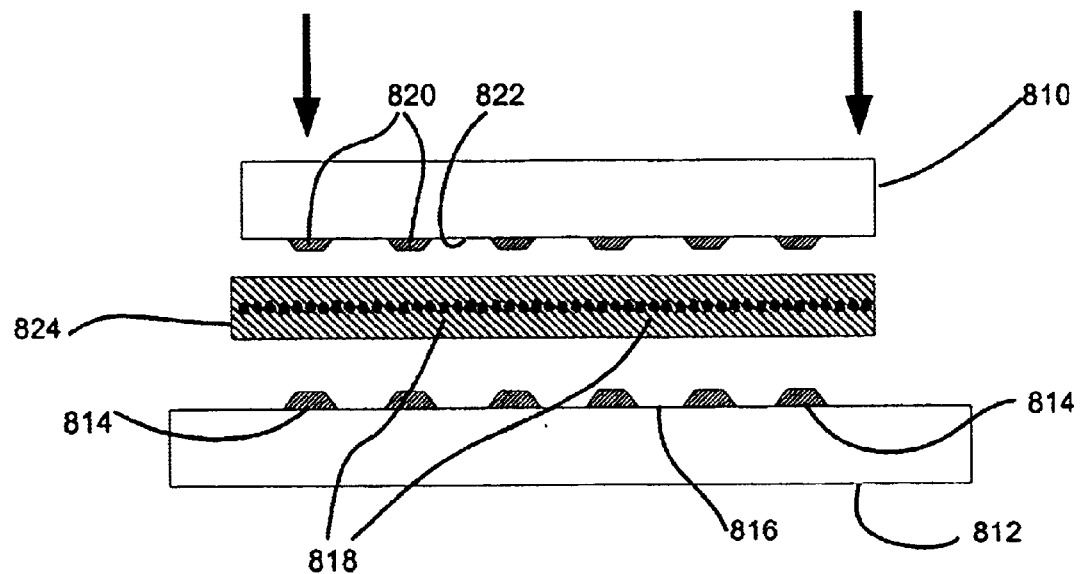
FIGS. 8A and 8B illustrate, in cross-section, a substrate and an electrical component undergoing an attachment method in accordance with a sixth process embodiment of the invention, in which an adhesive contains a substantially uniform layer of hard particles.
Figure 8B:
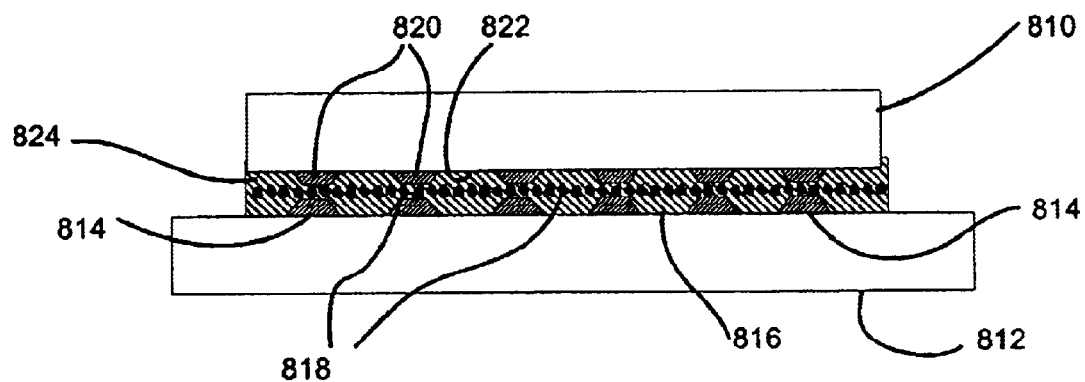

FIGS. 8A and 8B illustrate cross-sectional views of substrate 812 and electrical component 810 undergoing an attachment method according to a sixth process embodiment of the invention. Similar to the fifth process embodiment shown in FIGS. 7A and 7B, adhesive material 824 exists on its own as stand-alone film before assembly. As before adhesive material 824 may be either a solid material or an adhesive tape. Hard particles 818 may be suspended within adhesive material 824 and randomly distributed throughout adhesive material 824 at a fill density that is less than the percolation limit of hard particles 818 in the adhesive 824. A substantially uniform layer of hard particles 818 may be formed within the adhesive material 824 by, for example, first forming a first adhesive layer. A layer of hard particles 818 may then be spread upon the first layer by, for example, spraying particle slurry onto the first adhesive layer. A second adhesive layer may then be formed to overlie the hard particles 818 and the first adhesive layer. By maintaining hard particles 818 at a fill density below the percolation limit, the hard particles 818 may not touch one another, even after compression.

Adhesive material 824 is positioned between the face surface 822 of electrical component 810 and bonding surface 816 of substrate 812. Electrical component 810 and adhesive material 824 are then positioned so that bonding pads 820 face substrate 812 and align with contact lands 814. As in the previous embodiment, the adhesive material 824 with suspended hard particles 718 is positioned between electrical component 810 and substrate 812. Then, bonding pads 820 are moved into intimate contact with adhesive material 824 and contact lands 814, and a compressive force is applied, as previously described. Under the compressive force, hard particles 818 simultaneously pierce through the adhesive 824 and into bonding pads 820 of electrical component 810 and contact lands 814. Adhesive material 824 is hardened as previously described and then the compressive force is released, producing the assembly illustrated in FIG. 8B. Importantly, since the hard particles 824 do not touch one another, they do not conduct electricity laterally from one electrical connection between one bonding pad 820 and a respective contact land 814 to a neighboring electrical connection.

In one embodiment of the present invention, the electrical component attachment techniques previously described are employed in attaching a chip to a chip carrier, a chip module to an antenna, and/or a chip to an antenna in the construction of RFID devices, for example, smart cards and smart inlays. In general, the steps of RFID device construction include: (1) co-depositing metal and hard particles on a first electrically conductive contact surface; (2) applying a non-conducting adhesive on either the first contact surface, a second electrically conductive contact surface, or between the first and second contact surfaces; (3) placing the first contact surface in contact with the second contact surface, the non-conductive adhesive an particles between the first and second contact surfaces; (4) applying pressure to hold the first and second contact surfaces together; and (5) curing the non-conductive adhesive.

As in the attachment options described above, the hard particles can be applied to the contact surfaces of either the chip, the chip carrier, or the antenna. Because particle-enhancement of contact surfaces by the processes described herein is stable, it can be applied to the contact surfaces (e.g., bond pads, contact lands, and antenna contacts) of the chip, chip carrier, or antennae when individually manufactured and before delivery to the assembler of the RFID. Normally the antenna and chips are produced by companies other than the assembler of the RFID, or at least at different locations than where the final assembly occurs. Accordingly, the first two steps of particle-enhancement may be performed at a different time and location than the remaining steps of the invention. Further, if the adhesive is stable, e.g., the adhesive will not cure without some activation, or is perhaps a tape adhesive, it might be applied at the time of manufacture of the electrical component and be provided with a release coat to be removed at the time of product assembly. In any event, significant cost advantages may be obtained by incorporating the metal-particle coating of the contacts during the chip and/or antenna manufacturing process.

Indeed, a particularly significant advantage of the present invention is that the surface preparation, i.e., application of conductive hard particles, can be applied to the chip contact pads before the chips are diced from the semiconductor wafer. This has enormous cost implications because of the extremely high efficiency of wafer level processes. Because the number of chips per wafer can be very high, the per unit cost of producing chips with particle-enhanced bond pads may be very low.

Figure 9A:
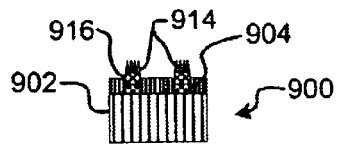
FIGS. 9A–9F are together a schematic showing the process steps employed in the assembly of a dual-interface smart card as the components, shown in cross-section, are attached to one another in accordance with the present invention.

FIGS. 9A–9F illustrate schematically and in cross-section a dual-interface smart card 930 assembly arranged in accordance with the present invention. FIG. 9G depicts a magnified view of the chip module 915 to antenna 928 connection. Similar to the prior art, chip 900 is generally composed of silicon die 902 with multiple bond pads 904 as shown in FIG. 9A. In this case, however, the bond pads 904 of chip 900 are particle-enhanced by the deposition of a metal layer 916 and conductive hard particles 914. The metal layer 916 is preferably nickel and the conductive hard particles 914 are preferably diamond particles coated with nickel. Chip 900 contains the necessary programming and data appropriate for the purpose of controlling the smart card 930.

Figure 9B:
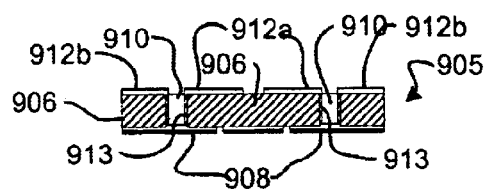

A chip carrier 905 for receiving chip 900 is shown in FIG. 9B. The chip carrier 905 is composed of a distribution layer of contact lands 912a and 912b and conductive tracks (not shown), usually of copper, for example, a copper flex circuit; a substrate 906, generally of a glass epoxy; and contact plates 908, for example, of copper plated with nickel and gold, on the opposite side of substrate 906 from contact lands 912a and 912b. The substrate 906 is formed with vias 910, or passages from one side of the substrate 906 to the other. These vias 910 are lined with conductive walls 913 that extend through the vias 910 to make electrical contact with contact plates 908 on the opposite side of substrate 906. The contact lands 912b of chip carrier 905 are particle-enhanced by the deposition of a metal layer 916 and conductive hard particles 914. The metal layer 916 is preferably nickel and the conductive hard particles 914 are preferably diamond particles coated with nickel.

The metal layers 916 on the contact lands 912b are preferably built up to a thickness to accommodate the submersion distance of antenna contacts 928a and 928b through antenna cavity 923, as described below with respect to FIG. 9D and best shown in FIG. 9G. For example, the metal layers 916 on contact lands 912b may have a thickness of about 25 microns to about 100 microns while the conductive hard particle layer 914 may have a thickness of about 2 microns to about 50 microns. Other modifications may be made to accommodate the connection between the chip carrier 905 and the antenna 928 depending upon the geometric features of the smart card 930 design. For example, the plating thickness of metal layer s 916 may be varied to accommodate depths of the antenna cavity 923. In an alternative embodiment, the particle-enhancement may be applied to the antenna contacts 928a and 928b rather than the contact lands 912b on the chip carrier 905.

Figure 9C:
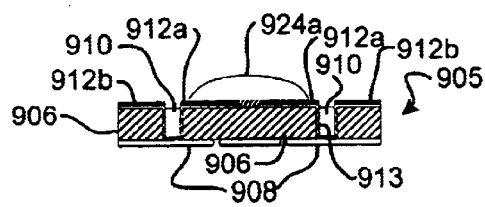

The chip carrier 905 is prepared for mechanical connection with the chip 900 as shown in FIG. 9C by the application of a non-conductive adhesive 924a on the contact lands 912a and the exposed substrate 906. No care need be taken with the application of the non-conductive adhesive 924a because the conductive hard particles 914 will pierce through the non-conductive adhesive 924a layer to reach the contact lands 912a underneath FIG. 9D). In the present invention, a preferred non-conductive adhesive 924a material is one that sets very rapidly without need for heat or other treatments, for example, cyanoacrylate. Alternatively, non-conductive adhesive 924a may be an ultraviolet-light (UV) curable polymer composition. Additionally, other types of non-conductive adhesives 924a may be used, such as a permanently hardenable adhesives, for example, a hot melt adhesive, and a polymerizable adhesive. In yet another alternative, non-conductive adhesive material 924a may be a pressure-sensitive adhesive.

Non-conductive adhesives 924a suitable for use in the present invention include, for example, cyanoacrylate materials such as SuperGlue® or Loctite TAKPAK 444. Cyanoacrylate is an inexpensive liquid that is easy to dispense. It is strong and cures very rapidly. Suitable hot melt adhesives include, for example, 3M 3792-LM-Q available from the 3M Company in St. Paul, Minn. Suitable pressure sensitive adhesives include Scotch brand 467 Hi Performance Adhesive and Scotch brand F9465PC adhesive transfer tape. Preferably, the adhesive material employed should have reduced levels of certain impurities that can adversely affect the component or the interconnection. In particular, sodium and chlorine ions are know to cause semiconductor chips to fail and promote corrosion of electrical interconnections under humid conditions. The industry recognizes a special purity grade, e.g., "electronics grade," of adhesives with virtually no ionic contamination. In chip applications, an electronics grade adhesive should be used because the adhesive comes into intimate contact with the chip. Other adhesives that might be employed include well-known electronics grade polymeric materials that are used as chip adhesives. Other adhesives may include materials such as epoxy molding compounds frequently used to encapsulate chips, and underfills, i.e., filled polymers, used under chips soldered directly to a substrate to mitigate stresses arising from the difference in thermal expansion rates of the chip and the substrate.

Figure 9D:
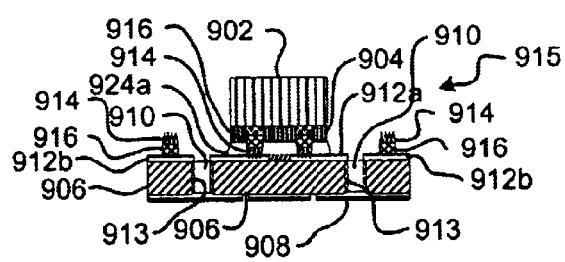

The chip 900 is attached to the chip carrier 905 electrically to form a chip module 915, as shown in FIG. 9D, by flipping the chip 900, aligning the particle-enhanced bond pads 904 with the contact lands 912a on the chip carrier 905, and applying pressure normal to the chip 900 so that the hard particles penetrate through the non-conductive adhesive 924a and into the contact lands 912a of the chip carrier 905. No surface preparation of the contact lands 912a is required as the conductive hard particles 914 break through any surface oxidation or other insulatory residue on the surface of the contact lands 912a to reach the conductive material underneath. A slight pressure may continue to be applied while the non-conductive adhesive 924a sets or cures. In some instances, this pressure will be applied inherently as a result of shrinkage during curing of the non-conductive adhesive 924a. This is a much quicker mechanical and electrical bonding process and consumes only a fraction more of the area of the chip 900 to complete the bond. No encapsulant is required to protect the connections as these are protected by the non-conductive adhesive 924a once it quickly cures and hardens. Further, no high temperatures, such as associated with prior art wire bonding and solder bump reflow techniques, are required, so there is much more flexibility in the choice of substrate materials for the chip carrier 905 and card body 918 that may be used.

Figure 9E:
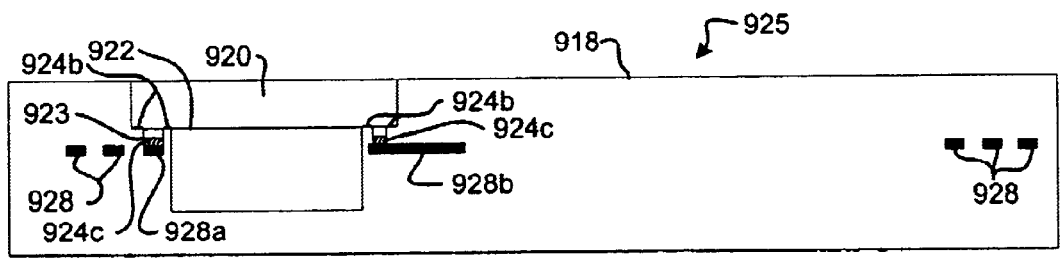

A smart card blank 925 as shown in FIG. 9E is composed of the card body 918 with a cavity 920 for receiving the chip module 915. The cavity 920 is further formed with a shelf 922 for supporting the edges of the chip module 915. The card body 918 further envelops antenna windings 928 that reside beneath the surface of the card body 918. The antenna 928 normally consists of several concentric loops or windings (depicted more visibly as element 1228 in the plan view of a smart inlay in FIG. 12B) to provide adequate reception and transmission capability. This type of antenna 128 is typically used for the 13.56 MHz Mifare system. The coil consists of 4 to 5 "windings," with a total resistance after lamination of about 2 to 6 ohms. The antenna 928 and card body 918 are typically prepared on a base by silver-paste printing and laminating. For example, the antenna 928 can be prepared by a silver-paste screen printing process with a cylinder screen-printing machine on an inner-layer sheet, typically PVC or similar material. Although not depicted in the drawing, the PVC and antenna can then be laminated together with graphically designed core-sheets and overlay-sheets with a thermo-transfer press. Additional antenna cavities 923 extend below the shelf 922 to provide access to antenna contacts 928a and 928b for electrical connection to the chip module 915.

FIG. 9E further shows the preparation of a smart card body 118 for receipt of and electrical and mechanical connection with the chip module 915 according to the present invention. Non-conductive adhesive 924c, which may be the same non-conductive adhesive 924a used for the chip 900 to chip carrier 905 attachment, is dispensed in the antenna cavities 923 to provide a mechanical connection between the antenna contacts 928a and 928b and the particle-enhanced contact lands 912b on the chip module 915. Additionally, nonconductive adhesive 924b, which again may be the same as non-conductive adhesives 924a and 924c, is applied to the shelf 922 and elsewhere within the cavity 920 in order to mechanically secure the chip module 915 to the smart card body 918.

Figure 9F:
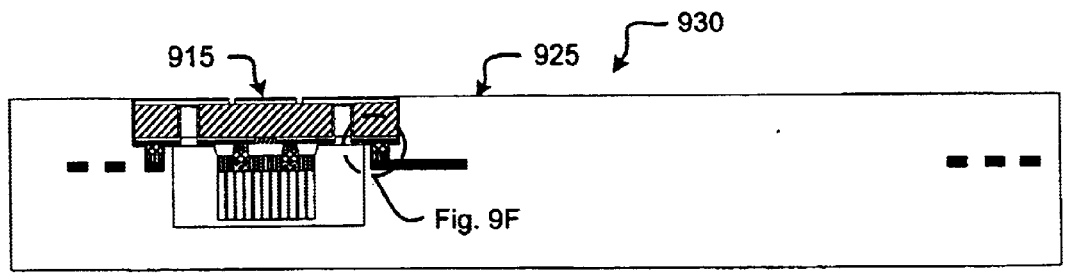
Figure 9G:
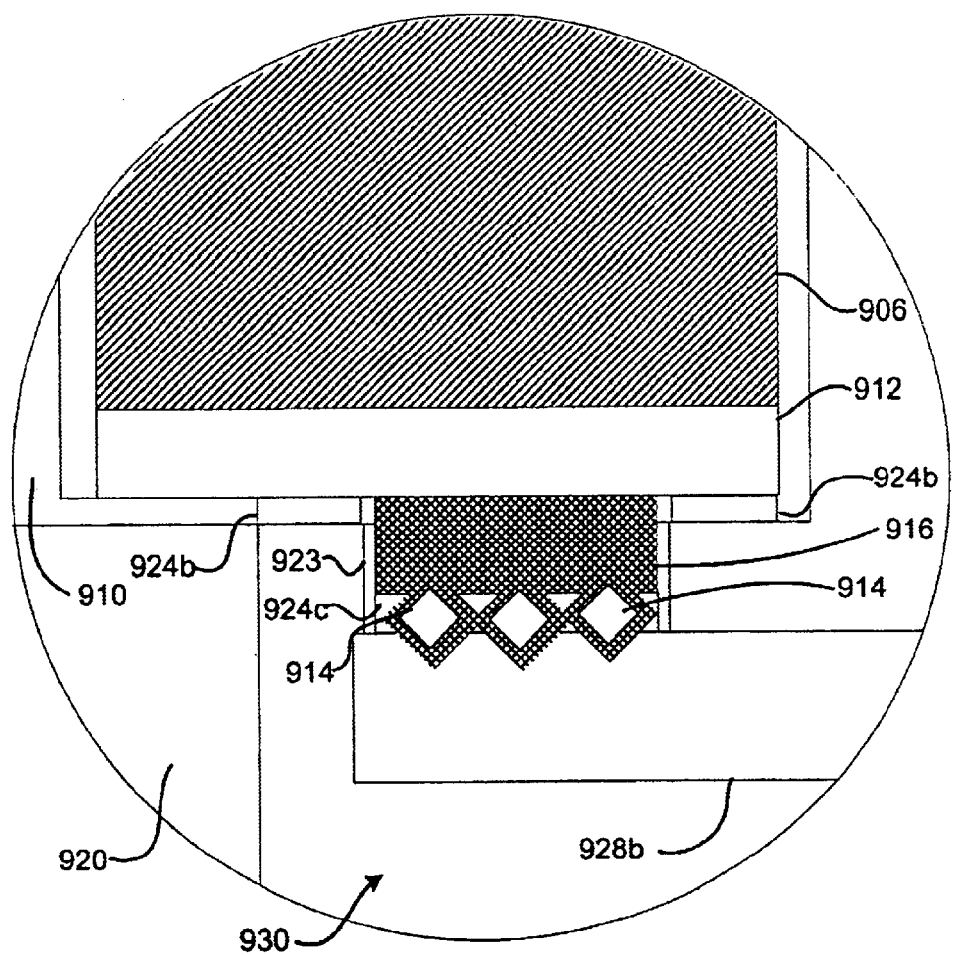
FIG. 9G is a magnified view of a portion of the cross-section of FIG. 9E detailing the connection between a substrate and an antenna in a smart card according to the present invention.

The chip module 915 is then inserted into the cavity 920 wherein the particle-enhanced contact lands 912b are aligned with and extend into the antenna cavities 923. The conductive hard particles 914 penetrate through the non-conductive adhesive 924c and pierce into the antenna contacts 928a and 928b. Again, no surface preparation of the antenna contacts 928a and 928b is required as the conductive hard particles 914 break through any surface oxidation or other insulatory residue on the surface of the antenna contacts 928a and 928b to reach the conductive material underneath. The chip 900 is thereby electrically connected both to antenna 928, which permits RF communication with an external device, and to contact plates 908 by way of the distribution tracks 913 in vias 910 that connect the contact lands 912a and 912b to the contact plates 908, which permits a physical electronic interface between the chip 900 and a card reader through the contact plates 908. In either case, the power for the chip 900 is supplied by the card reader or external RF device. The chip module 915 is mechanically bonded to the card body 918 with heat, pressure, or both. A fully assembled dual-interface smart card 930 according to the present invention is depicted in FIG. 9F.

An advantage of the present invention is the non-conductive adhesive 924a, 924b, and 924c can be applied rather indiscriminately because a coating of conductive hard particles 914 has already been applied to the electrical contacts on the chip 900, chip carrier 905, or antenna contacts 928a and 928b. This can be accomplished in an automated system, such as a robot controlled syringe, in which a hollow needle dispenses a controlled volume of adhesive. Because the adhesive used in the present invention is non-conductive, its presence on the contact surfaces in prior art systems would normally interfere with the formation of an electrical connection. However, the present invention has the ability to penetrate this barrier, i.e., the ability to form a conductive link through the non-conductive binding material.

Figure 1A:
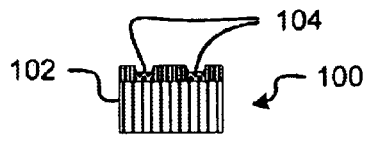
FIGS. 1A–1E are together a schematic showing the general process steps typically employed in the assembly of a dual-interface smart card as the components, shown in cross-section, are attached to one another in a typical prior art device.
Figure 1B:
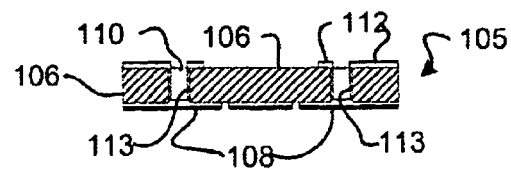
Figure 1C:
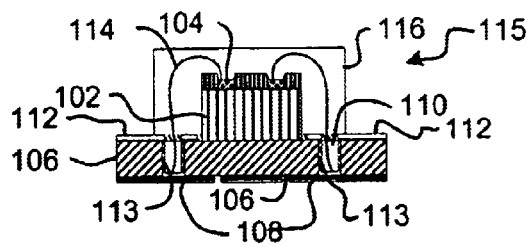
Figure 1D:
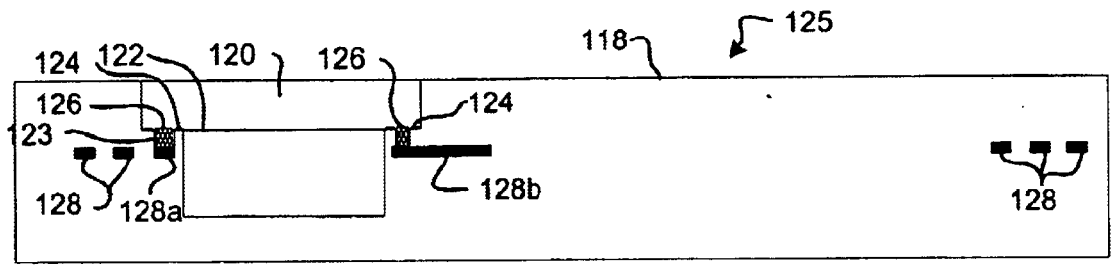
Figure 1E:
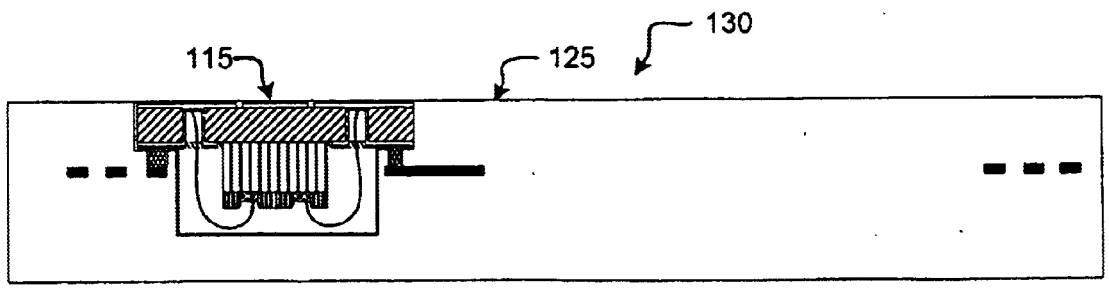
Figure 10:
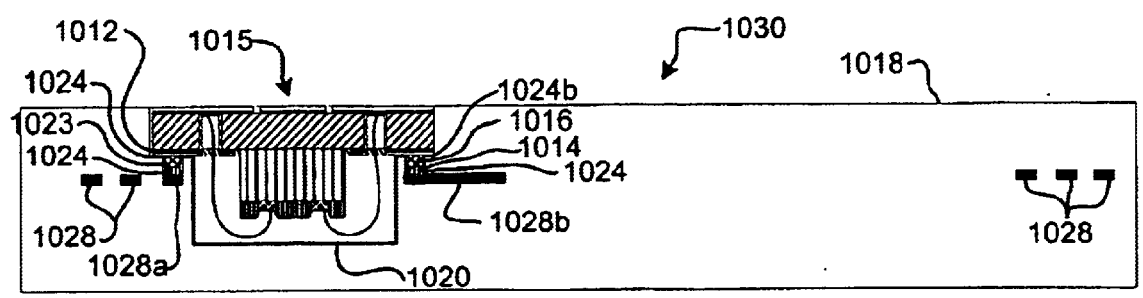
FIG. 10 illustrates, in cross-section, the assembly of a of a dual-interface smart card as the components, shown in cross-section, are attached to one another in accordance with another embodiment of the present invention.

As noted previously, suitable applications of the present invention include for a chip to chip carrier connection (e.g., contact, contactless, and dual-interface smart cards) and for a chip module to antenna connection (e.g., dual-interface and contactless smart cards). FIGS. 9A–9G depict both of these applications. FIG. 10 presents a combination of a prior art module assembly with the teachings of this invention in the creation of smart card 1030. In FIG. 10, a prior art, wire bonded chip module 1015, such as chip module 115 depicted in prior art FIG. 1C, is particle-enhanced at contact lands 1012. Metal 1016 and conductive hard particles 1014 are deposited on contact lands 1012 of chip module 1015. Non-conductive adhesive 1024 is then applied to the cavity 1020 of card body 1018 and antenna cavities 1023. The chip module 1015 is then placed within the cavity 1020 and the chip 1015 to antenna 1028 contact is achieved by the conductive hard particles 1014 piercing through the non-conductive adhesive 1024 and into the antenna contacts 1028a and 1028b as previously described with respect to FIG. 9F.

Figure 11A:
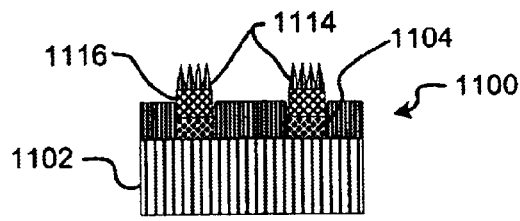
FIGS. 11A–11D are together a schematic showing the process steps employed in the assembly of a of a smart inlay as the components, shown in cross-section, are attached to one another in accordance with the present invention.

In addition, the present invention can be employed in the formation of chip to antenna connection, e.g., in the construction of smart inlays. FIGS. 11a–11D show the assembly of a smart inlay 1130 as another embodiment of the present invention. As with a smart card, chip 900 is generally composed of silicon die 1102 with multiple bond pads 1104 as shown in FIG. 11A. The bond pads 1104 of chip 1100 are again particle-enhanced by the deposition of a metal layer 1116 and conductive hard particles 1114. The metal layer 1116 is preferably nickel and the conductive hard particles 1114 are preferably diamond particles coated with nickel. Chip 1100 contains the necessary programming and data appropriate for the purpose of controlling the smart inlay 1130. In smart inlay applications, chip 1100 is generally thinner and more flexible than smart card chips, and is therefore more fragile.

Figure 11B:
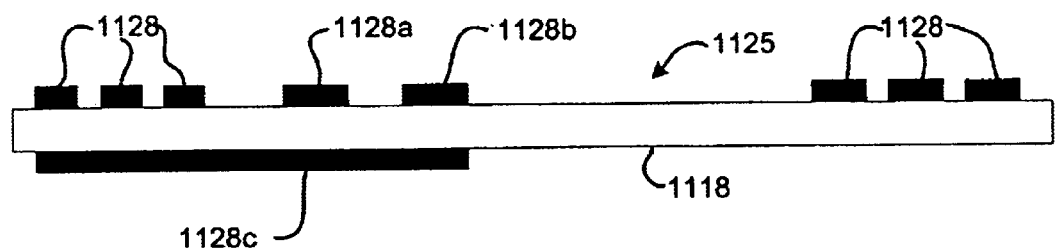
Figure 11C:
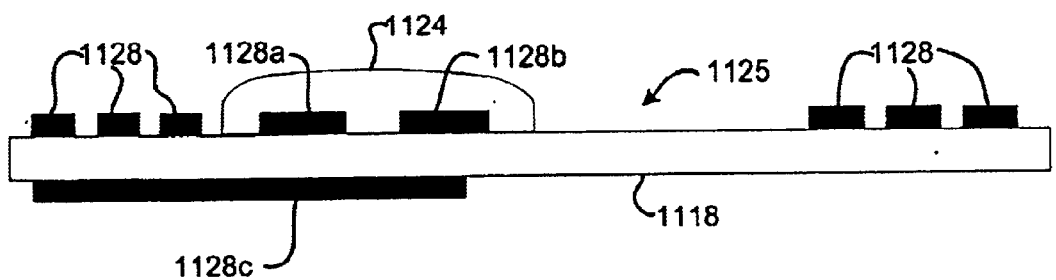
Figure 11D:
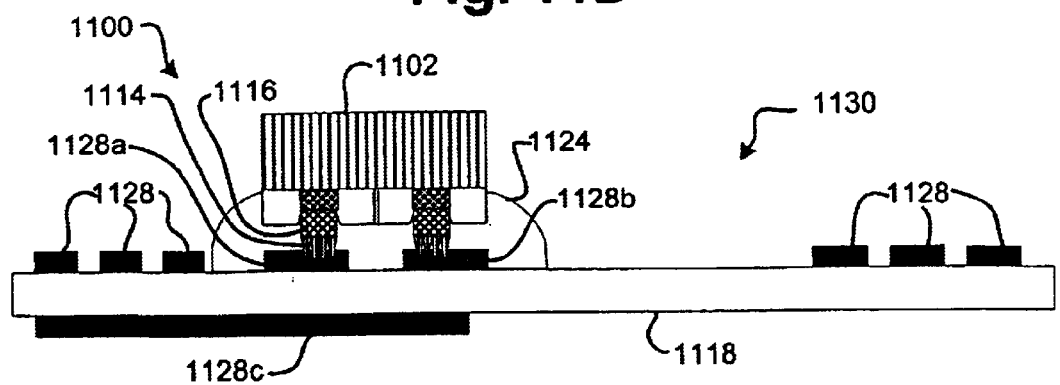

FIG. 11B depicts a smart inlay base 1125 composed of a substrate 1118 and a conductive area that is the antenna 1128. The substrate material 1118 may be paper or plastic foil made, for example, of polyvinyl chloride (PVC), polyethylene (PET), and polypropylene. Generally, any material that is thin, non-conductive, and flexible may be used for substrate 1118. The conductive area may be made, for example, of copper, aluminum, silver, gold, and carbon, and applied to the substrate, for example, by screen printing a metal paste or etching a foil laminate layer. Antenna contacts 1128a and 1128b are provided on the top of substrate 1118 for direct placement of the chip 1100. A bridge 1128c on the bottom side of the substrate 1118 provides an electrical connection through apertures in the substrate 1118 between antenna contact 1128b and the end of the conducting area 1128 opposite the end of the conducting area 1128 at antenna contact 1128a. Therefore, the conductive area for the antenna 1128 is formed on both side s of the substrate 1118. It should be noted that, according to the present invention, particle-enhancement can be applied either on the chip bond pads 1104 or to the antenna contacts 1128a and 1128b on the substrate 1118.

In order to mechanically attach the chip 1100 to the smart inlay base 1125, a non-conductive adhesive 1124 is applied to the antenna contacts 1128a and 1128b and exposed substrate 1118 within the area of the antenna contacts 1128a and 1128b. Non-conductive adhesive 1124 may be, for example, cyanocrylate, epoxy, light-sensitive epoxy, and acrylate. The chip 1100 is then picked and flipped to align its particle-enhanced bond pads 1104 with the antenna contacts 1128a and 1128b. The chip 100 is then placed on the antenna contacts 1128a and 1128b with a small force normal to the substrate 1118 surface to finish the assembly.

The conductive hard particles 1114 penetrate through the non-conductive adhesive 1124 and pierce into the antenna contacts 1128a and 1128b. No surface preparation of the antenna contacts 1128a and 1128b is required as the conductive hard particles 1114 break through any surface oxidation or other insulatory residue on the surface of the antenna contacts 1128a and 1128b to reach the conductive material underneath. The chip 1100 is thereby electrically connected to the antenna 1128, which permits RF communication with an external device. As with a smart card, power is supplied to the smart inlay 1130 by induction from the external RF reading device.

Figure 12A:
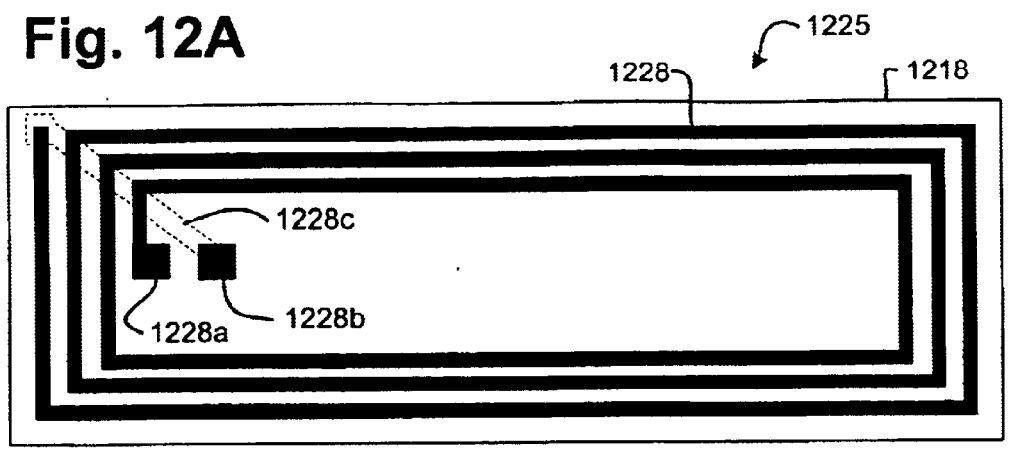
FIGS. 12A–12D are plan views of a variety of antenna configurations and chip to antenna connections in smart inlays according to the present invention.

FIG. 12A depicts a first embodiment of conducting area 1228 of a coil antenna structure on a smart inlay base 1225. The number of coil windings of the conducting area 1228 is dependant on the are of the smart inlay substrate 1218 and the requirements of the particular chip used. The conducting area may be made, for example, of copper, aluminum, silver, gold, and carbon, and applied to the substrate, for example, by screen printing a metal paste or etching a foil laminate layer. The substrate material 1218 may be paper or plastic foil made, for example, of polyvinyl chloride (PVC), polyethylene (PET), and polypropylene. Antenna contacts 1228a and 1228b are provided on the top of substrate 1218 for placement of a chip as described with reference to FIGS. 11A–11D. A bridge 1228c on the bottom side of the substrate 1218 provides an electrical connection through apertures in the substrate 1218 between antenna contact 1228b and the end of the conducting area 1228 opposite the end of the conducting area 1228 at antenna contact 1228a. In this embodiment, therefore, the conducting area 1228 is formed on both sides of the substrate 1218.

Figure 12B:
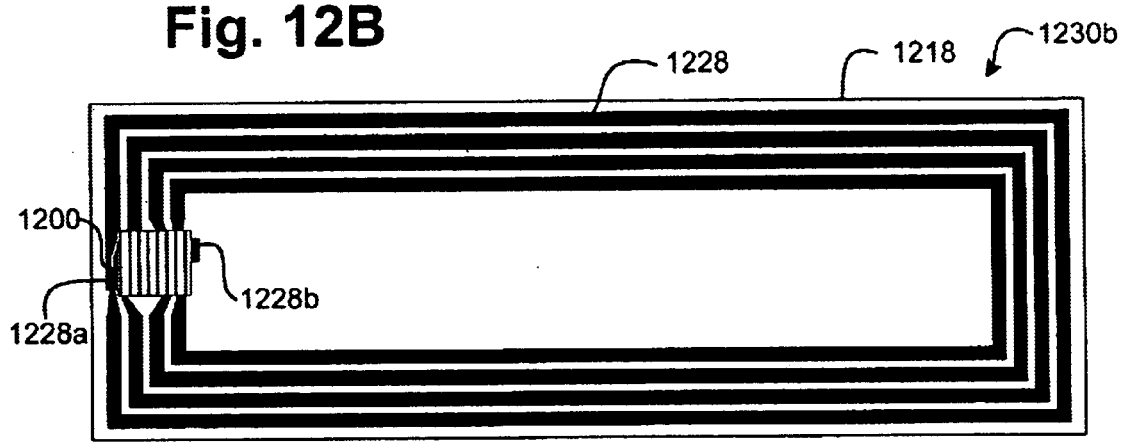

FIG. 12B depicts a second embodiment of a conducting area 1228 designed as a multiple coil antenna in a smart inlay 1230b. In this embodiment there is no bridge and the chip 1200 is positioned over the windings of the conductive area 1228 to connect to antenna contacts 1228a and 1228b connecting the ends of one or more of the coils as discussed above with reference to FIGS. 11A–11D. Also the conductive area 1228 is only on one side of the substrate 1218.

Figure 12C:
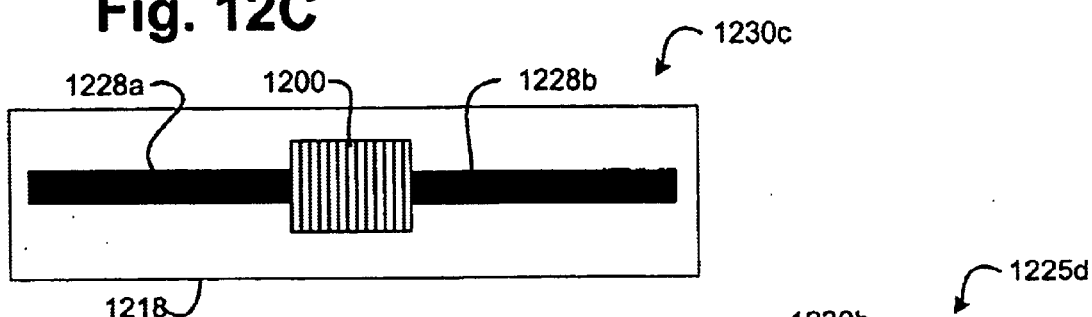

FIG. 12C depicts a third embodiment of a conducting area 1228 for a smart inlay 1230c. The conducting area consists of a first rectangular conducting area 1228a and a second 1228b rectangular conducting area extending from each side of the chip 1200 along the length of the substrate 1218 of the smart inlay 1230c. The chip 1200 electrically connects with both first rectangular area 1228a and second rectangular area 1228b by its particle-enhanced bond pads as described in FIGS. 11A–11D. This design of conducting areas 1228a and 12228b is, for example, of a high frequency antenna.

Figure 12D:
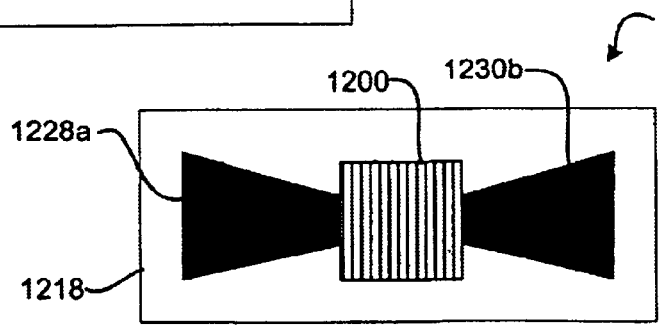

FIG. 12D depicts a fourth embodiment of a conducting area 1228 for a smart inlay 1230c. The conducting area consists of a first triangular conducting area 1228a and a second 1228b triangular conducting area extending from each side of the chip 1200 along the length of the substrate 1218 of the smart inlay 1230c. Other polygonal shapes may likewise be used for conducting areas depending upon the design requirements. The chip 1200 electrically connects with both first triangular area 1228*a* and second triangular area 1228*b* by its particle-enhanced bond pads as described in FIGS. 11A–11D. This design of conducting areas 1228*a* and 12228*b* is, for example, of a high frequency antenna. Again, the conductive areas 1228*a* and 1228*b* in the embodiments of both FIGS. 12C and 12D are only formed on one side of the substrate 1218.

Figure 13:
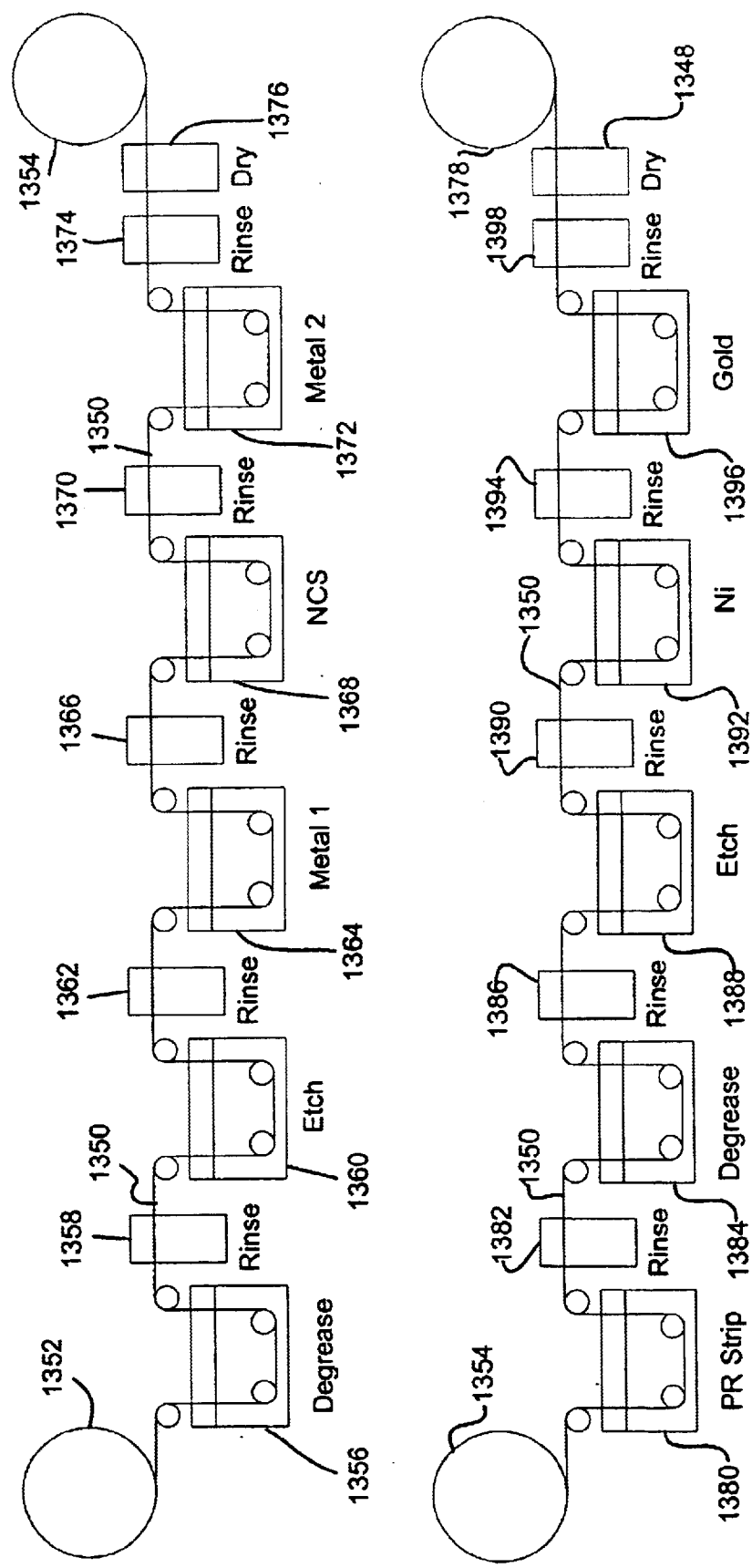
FIG. 13 is a schematic diagram of an exemplary plating process for plating hard particles to contact lands on a flexible circuit substrate.

An exemplary plating process for plating layers of metal and hard particles on the contact lands of a copper flex circuit tape in accordance with one embodiment of the invention will now be described. The process illustrated in FIG. 13 can be used, for example, to plate hard particles on contact lands on a substrate, and thereby form a "bumped" electrical contact, such as the antenna contact 932 of the smart card in FIGS. 9F and 9G.

In a first stage of the process, a copper flex circuit tape 1350 is dispensed by a dispense reel 1352 and is drawn through a series of process stages by a take-up reel 1354. Before spooling circuit tape 1350 onto dispense reel 1352, photolithographic processing is carried out to form a patterned layer of photoresist (not shown) overlying circuit tape 1350. The photoresist layer has contact openings therein that expose contact lands similar to those described above on circuit tape 1350. During processing, circuit tape 1350 is first conveyed from dispense reel 1352 to a cleaning tank 1356. Cleaning tank 1356 contains an acidic cleaning solution and a wetting agent. For example, a mixture of formic and sulphuric acid can be used to remove organic films overlying the surface of the contact lands on circuit tape 1350 that are exposed by the photoresist layer. Upon exiting cleaning tank 1356, circuit tape 1350 passes through a first rinse stage 1358. First rinse stage 1358 exposes circuit tape 1350 to an aqueous rinsing solution to flush away residual cleaning solution and particulate matter. The first rinse stage 1358, as well as the following indicated rinse stages, may also incorporate a pressure wash system over either the top of bottom of the circuit tape 1350, or both.

After cleaning, circuit tape 1350 is conveyed to an etch tank 1360. Etch tank 1360 contains a copper etching solution that removes copper and copper oxides and other dielectric films overlying the surface of the contact lands. Preferably, etch tank 1360 is charged with a potassium persulphate solution. After etching, circuit tape 1350 passes through a second rinse stage 1362 where residual etching solution and particulate matter are removed by exposure to an aqueous solution.

Following the dielectric etching step, circuit tape 1350 enters a first metal plating bath 1364. In first metal plating bath 1364, the contact land on circuit tape 1350 is preferably plated with a layer of nickel to a thickness of about 25 to about 100 microns. The specific thickness of the plated nickel layer will vary depending upon the particular type of electronic component assembly to be fabricated using circuit tape 1350. Preferably, first metal plating bath 1364 contains a low-stress nickel plating solution including nickel sulphamate and nickel bromide in a boric acid solution. After plating a nickel in first metal plating bath 1364, circuit tape 1350 passes through a third rinse stage 1366, where an aqueous rinse solution removes residual chemicals and particulate matter from first metal plating bath 1364.

Next, circuit tape 1350 is fed into a particle plating bath 1368. In particle plating bath 1368, a layer of nickel-plated diamond particles are plated onto the plated nickel base layer. As will subsequently be described in greater detail, in particle plating bath 1368, the nickel-plated diamond particles pass through a mesh anode located in the bath before contacting the contact lands on circuit tape 1350. Preferably, the mesh anode is constructed of platinum-coated titanium metal. After plating the particle layer, circuit tape 1350 passes through a fourth rinse stage 1370 to remove residual chemicals and particulate matter from particle plating bath 1368.

After plating the particle layer, circuit tape 1350 is fed into a second metal plating bath 1372. In second metal plating bath 1372, a second layer of nickel is plated over the particle layer to form a particle anchor layer that seals the particles to the contact lands. The particle anchor layer may be plated to a thickness of substantially one half the size of the particular hard particles. For example, for particles having a size of about 20 microns, the particle anchor layer is plated to a thickness of about 10 microns. After plating the nickel overcoat layer, circuit tape 1350 passes through a sixth rinse stage 1374 to remove residual chemicals and particulate matter from second metal plating bath 1372. Finally, circuit tape 1350 is dried by a drying system 1376 to remove water and residual solvents from circuit tape 1350 before the collection of circuit tape 1350 by take-up reel 1354.

Once the contact lands on circuit tape 1350 have been metallized and affixed with hard particles, a second stage of the process may be undertaken to remove the photoresist and form a nickel and gold overcoat layer on circuit tape 1350. Although the entire process is described herein in two stages, these stages can be combined into one process line, obviating the need for drying system 1376 and take-up reel 1354. In a single process line, the circuit tape may continue directly from the sixth rinse stage 1374 to photoresist stripping tank 1380. The two stage embodiment described herein, is shown merely to indicate that the process can be broken into multiple stages, for instance, to accommodate space limitations, or to provide greater flexibility depending upon the process result desired. Also, it may be desired to simply affix hard particles to contact lands in a metallization process, without further desire to strip photoresist or provide additional metallization at the same time.

The second stage of the process in the depicted embodiment continues by dispensing circuit tape 1350 from take-up reel 1354 through a series of process stages and finally drawing up circuit tape 1350 by a take-up reel 1378. Circuit tape 1350 is dispensed by take-up reel 1354 first into a resist stripping tank 1380 that contains a photoresist dissolving solution, such as an alkaline solution of monoethylamine and butylcellusolve. Once the photoresist is removed, circuit tape 1350 passes through a seventh rinse stage 1382 and is conveyed into a cleaning tank 1384. Cleaning tank 1384 contains a solution similar to that contained in cleaning tank 956 for the removal of organic residues from circuit tape 1350.

After rinsing chemical residues away in an eighth rinse stage 1386, circuit tape passes into an etching tank 1388. Etching tank 1388 contains the previously described copper etching solution. Upon the removal of native oxides in etching tank 1388, circuit tape 1350 passes through a tenth rinse stage 1390 before conveyance into a nickel plating bath 1392. Preferably, nickel plating bath 1392 contains a nickel plating solution similar to that described above with respect to nickel plating baths 1364 and 1372. In nickel plating bath 1392, a layer of nickel having a thickness sufficient to act as a diffusion barrier for the underlying metallization is formed. Preferably, a nickel layer having a thickness of about 2 microns to about 25 microns and, more preferably, about 5 to about 15 microns, is plated onto circuit tape 1350.

After rinsing away residual chemicals and particulates from nickel plating bath 992 in an eleventh rinse stage 1394, circuit tape 1350 is conveyed to a gold plating bath 1396. Gold plating bath 1396 contains a gold plating solution, such as Technic Orosene 80, comprising potassium orocyanide. In gold plating bath 1396, a gold layer is deposited on circuit tape 1350 preferably having a thickness of about 10 to about 40 micro-inches, and more preferably about 30 micro-inches.

After rinsing away chemicals and particulate matter from gold plating bath 1396 in a twelfth rinse stage 1398, circuit tape 1350 is dried in air dryer 1348 before collection by take-up reel 1378. Preferably, air drying systems 1348 and 1376 operate in order to remove water and residual solvents from circuit tape 1350 before collection and storage on take-up reels 1354 and 1378.

Although the foregoing description is set forth with respect to nickel plating on a copper flexible circuit, those skilled in the art will appreciate that other metallized contact structures can be formed using the process described above. For example, a variety of metals, intermetallics, and alloys, for example, copper and tin-lead solder, may be plated onto both rigid substrates and the flexible circuit tape. Additionally, both rigid and flexible substrates can be materials such as, for example, epoxy, epoxy-glass, polyimide, Teflon, and bismalyimide triazine (BT).

The flexible substrate need not be a flex circuit. The process can also be used to metallize and affix hard particles to small, rigid components such as ceramic circuit boards, modules, interposers, and other tiny circuit boards. Typically, metallization and hard particle deposition on such rigid components are performed in batch processes. However, these small, rigid components may be temporarily affixed or adhered to a flexible tape, preferably with a metallic adhesive. Using the flexible tape as a carrier, the small, rigid components can be drawn through the metallization and hard particle deposition process disclosed herein. A metallic adhesive is preferred in order to electrically connect the small, rigid component to a cathode circuit for plating to occur. Furthermore, the hard particles can be any of the materials described elsewhere in this specification. Those skilled in the art will also appreciate that the chemical composition of the various plating, etching, and rinsing solutions will change depending upon the particular metals used to form the metallized contacts.

Figure 14A:
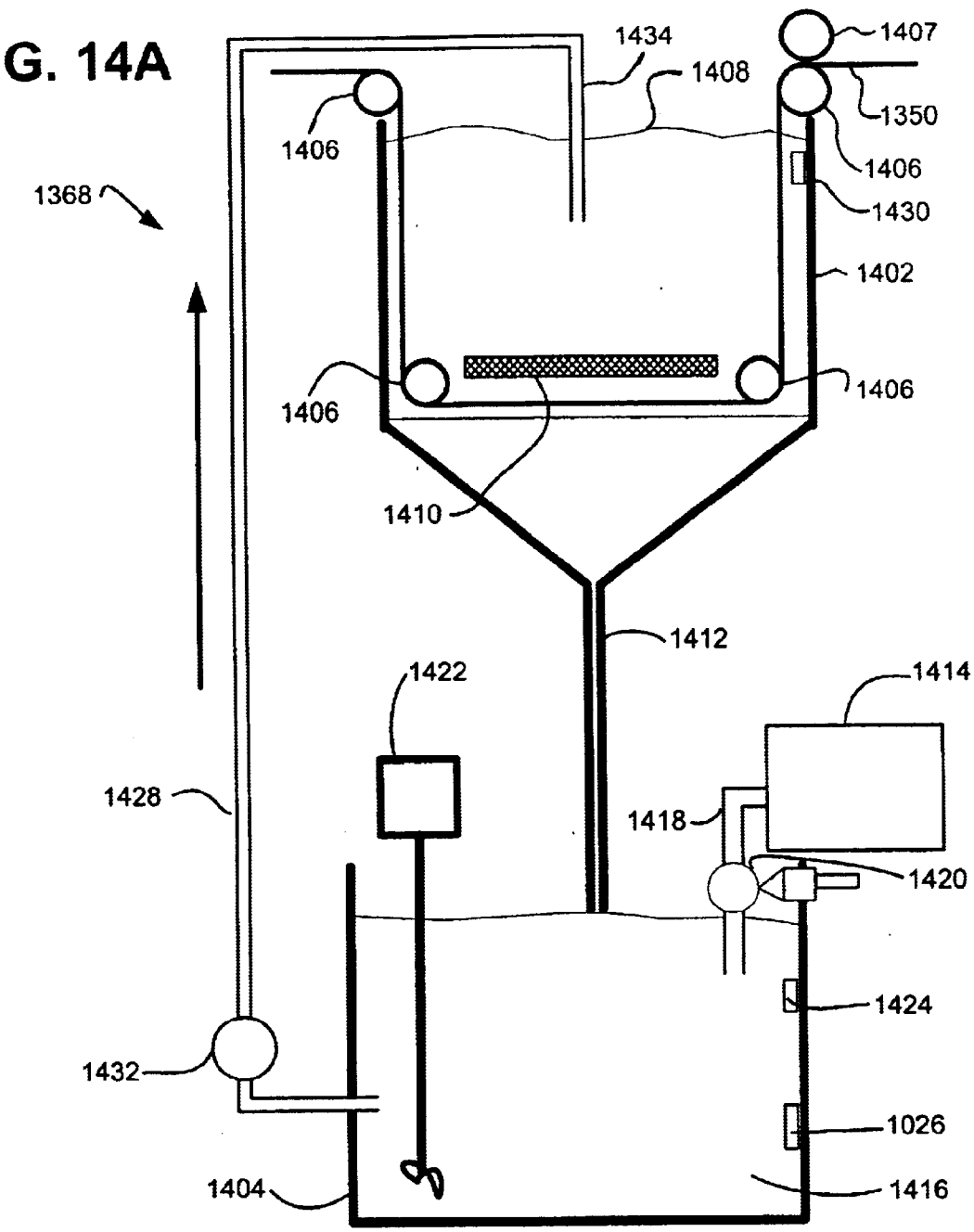
FIG. 14A is a schematic drawing of an exemplary particle plating bath arranged in accordance with the invention.

Shown in FIG. 14A is a schematic diagram of particle plating bath 1368 arranged in accordance with one embodiment of the invention. Particle plating bath 1368 includes a plating tank 1402 and a solution reservoir 1404. Plating tank 1402 contains a plating solution 1408 through which circuit tape 1350 is drawn while being guided by pulleys 1406. Before its submersion in plating tank 1402, circuit tape 1350 is negatively charged to a voltage of about 1 to about 2 volts such that the circuit tape 1350 acts as a cathode to promote the metallic plating process. In a preferred embodiment, each edge of the circuit tape 1350 is electrically conductive and in electrical connection with the portions of the surface of the circuit tape 1350 to be plated.

Figure 14B:
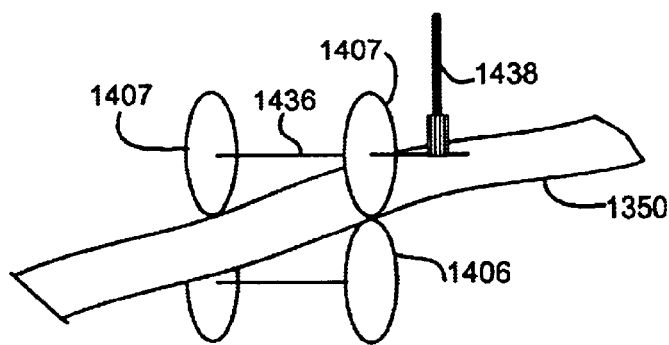
FIG. 14B is a schematic drawing of an electrical connection detail of the exemplary particle plating bath of FIG. 14A.

Pulleys 1406 preferably consist of paired guide wheels or tracks on each side of the circuit tape 1350 that support each edge of the circuit tape 1350. Pinch rollers 1407 press against the edges of the circuit tape 1350 opposite the first set of pulleys 1406. Pinch rollers 1407 are electrically conductive and are in electrical connection with the conductive edges of the circuit tape 1350, thereby providing the voltage to the circuit tape 1350. Preferably, axel 1436 supporting pinch rollers 1407 is electrically conductive and connects pinch rollers 1407 to a voltage source via metal brush connection 1438, best shown in FIG. 14B. Each pair of paired pulleys 1406 and pinch rollers 1407 are preferably mounted on respective common axels by frictional engagement, thereby allowing each guide wheel pair to be spaced closer together or farther apart from each other to accommodate varying widths of circuit tape 1350.

A mesh anode 1410 of platinum coated titanium metal is positioned in a portion of plating tank 1402 above the circuit tape 1350 and is positively charged to a voltage of about 1 to about 2 volts. The major plane of the anode 1410 is preferably placed in parallel with the major plane of the circuit tape 1350 to foster uniform metal plating and hard particle deposition. When plating hard particles, the circuit tape 1350 is preferably horizontal in order to maximize the deposition of hard particles, which fall through the plating solution by gravity flow. In general, the hard particle flow is ideally perpendicular to the surface of the circuit tape 1350 (or any other substrate desired to be plated). In practice, the circuit tape 1350 can be up to a 45-degree angle to the hard particle flow and still achieve adequate particle deposition. A mesh anode 1410 is preferred, allowing the hard particles to flow through the anode and deposit on the circuit tape 1350. While still possible, a solid anode makes hard particle deposition on the circuit tape 1350 more difficult.

During nickel-particle plating, diamond particles pass through openings (not shown) in mesh anode 1410 and deposit onto circuit tape 1350. As previously described, plating solution 1408 is preferably a mixture of nickel sulphamate and nickel bromide in an aqueous boric acid solution. Preferably, plating solution 1408 has a nickel sulphamate concentration of about 300 to about 500 grams/liter, and a nickel bromide concentration of about 10 to about 20 grams/liter. Amounts of boric acid are added to obtain a pH of about 3 to about 4.5. Plating solution 1408 also includes wetting agents and anti-foaming agents, and is preferably maintained at a temperature of about 50° C. to about 60° C.

The thickness of a nickel-particle layer formed on circuit tape 1350 will depend upon several process parameters. For example, the deposition rate will vary with the current density for a given bath composition. Additionally, the transport speed of the tape and the residence time within the bath will also affect the metal thickness. Transport speeds of the circuit tape 1350 are preferably between 0.13 mm/sec and 1.13 mm/sec. This range is based upon a current density in the particle plating bath 1368 of between 100 A/ft$^2$ and 200 A/ft$^2$. A preferred transport speed that provides the desired nickel layer thickness of between 25 and 100 microns before the hard particle deposition is about 0.3 mm/sec at a current density of about 100 A/ft$^2$. In accordance with the invention and in a preferred embodiment, the particle density in the particle plating bath 1368 is adjusted as the other process parameters are adjusted, such that preferably a 10 to 100 percent monolayer, and more preferably about a 50 percent monolayer, of particles is plated onto circuit tape 1350.

The concentration of particles in plating solution 1408 is maintained by recirculation from solution reservoir 1404. Solution reservoir 1404 receives return solution from plating bath 1402 through recirculation tube 1412. In solution reservoir 1404, the concentration of particles is maintained by a particle feed system 1414. Particle-feed system 1414 injects particles into a make-up solution 1416 through tube 1418. The quantity of particles added to make-up solution 1416 is regulated by a restrictor valve 1420 positioned in tube 1418.

Make-up solution 1416 is continuously agitated by a mechanical agitation system 1422 to ensure a uniform distribution of particles within make-up solution 1416. The volume of solution is continuously monitored in solution reservoir 1404 by a liquid-level switch 1424. Additionally, the concentration of nickel sulphamate and nickel bromide is continuously monitored by a concentration sensor 1426.

To maintain a control nickel-particle deposition rate in plating tank 1402, make-up solution 1416 is continuously recirculated to plating tank 1402 through a recirculation line 1428. A level switch 1430 in plating tank 1402 continuously monitors the volume of plating solution 1408. As plating solution 1408 is depleted in plating tank 1402, a pump 1432 is activated by level switch 1430 to provide make-up plating solution 1416 into plating tank 1402 through a nozzle 1434.

It is important to note that the component arrangement of particle plating bath 1368 illustrated in FIG. 14A is merely an example of one possible arrangement of components. Those skilled in the art will appreciate that various arrangements are possible for maintaining relatively constant plating conditions within particle plating bath 1368. For example, plating tank 1402 and solution reservoir 1404 can be a single unit in which plating conditions are maintained by a combination of particle make-up, concentration regulation and agitation subsystems.

Figure 15A:
FIG. 15A is a cross section view of a contact surface before metal-particle deposition, depicting the first step in the series of the co-deposition process.
Figure 15B:
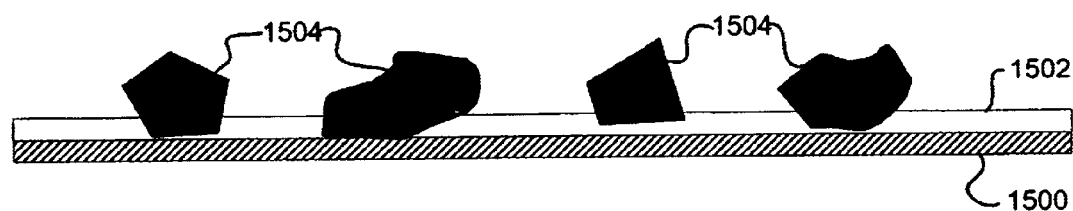
FIG. 15B is a cross section view of the contact surface of FIG. 15A with a metal-particle co-deposition layer, depicting the second step in the series of the co-deposition process.
Figure 15C:
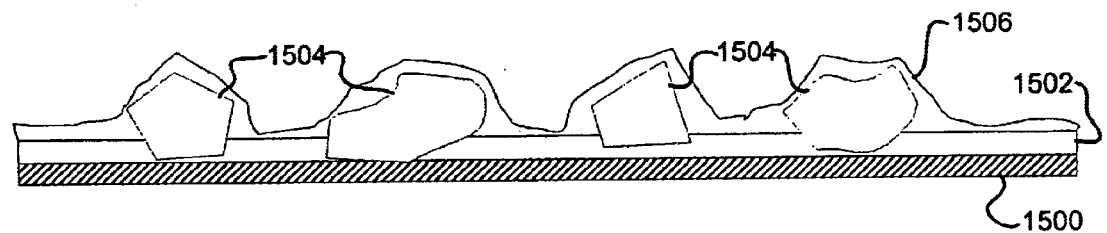
FIG. 15C is a cross section view of the contact surface of FIG. 15B with the addition of a second metal plated layer, depicting the third step in the series of the co-deposition process.
Figure 15D:
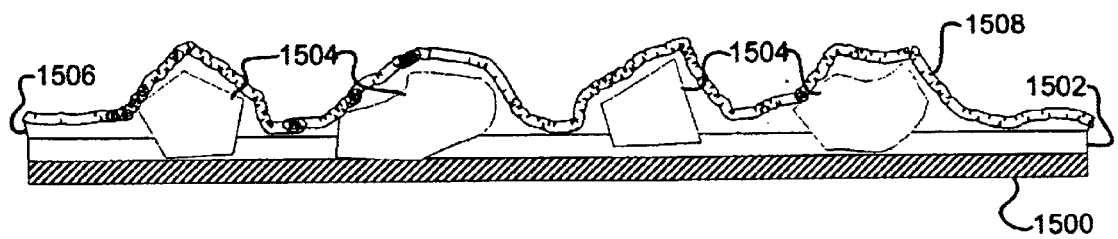
FIG. 15D is a cross section view of the contact surface of FIG. 15C with the addition of an immersion gold layer, depicting the fourth step in the series of the co-deposition process.

Another preferred method for attaching particles to contact surfaces is an electroless process that creates a co-deposited metal-particle surface for improved electric joining. Typically, the resulting surface made by the present method includes a co-deposited metal-particle layer, an overcoat of the same metal used in the prior co-deposition, and a thin layer of immersion gold. FIGS. 15A–15D schematically illustrate the evolution series of the inventive process. FIG. 15A shows an original, single, isolated contact surface 1500, for example, of either a copper or aluminum substrate. FIG. 15B shows the resulting metal-particle co-deposition on the contact surface 1500 plated by a first electroless metal-particle solution. The particles 1504 are partially trapped and held on the contact surface 1500 by the first metal layer 1502 electrolessly deposited on the contact surface 1500. FIG. 15C depicts the results of a second electroless metal plating step. A second metal layer 1506 is deposited on the previously co-deposited first metal layer 1502 and particles 1504 on the contact surface 1500. Generally, in order to cover the particles 1504 with the second metal layer 1506, the particles 1504 must first be activated to accept the second electroless metal deposition. FIG. 15D shows a thin layer of gold overcoat 1508 on the top of the second metal layer 1506 by immersion gold. FIG. 15D represents the typical cross section of a plan view of a contact surface after being processed by the metal-particle co-deposition method of the present invention.

In contrast with prior art composite electroless plating processes, the purpose of the co-deposition process of the present invention is to form a unique conductive, sandpaper-like surface design and provide enhanced electrical contact and thermal transfer. Instead of serving as backbone for the dense inclusion of particulate matters in conventional composition deposition, the electroless metal-particle co-deposition of this invention functions more like glue, bonding the hard particles to the surface contacts. The particles are actually trapped in the metal deposition by happenstance of their location in solution. The process is able to generate a co-deposited metal-particle surface of any thickness, but a surface on the order of average particle size with a single-particle layer is preferred for optimized electrical, mechanical, and thermal connections.

The hard particles contemplated by the present invention may be selected from diamonds (polycrystalline or monocrystalline types), ceramics, metals, oxides, suicides, carbonates, borides, silicates, nitrides, and various other compounds as long as the particle is harder than the applicable substrate contacts, so that it can preferably pierce into the substrate contacts. The particles that can be used in this process encompass a wide range of particle size and density. Preferably the particle size is from 0.5 to 50 microns, and the density ranges between 1.5 and 8 $g/cm^3$.

The contact surface prepared by the present invention can pierce any electric barriers on the contact surface itself and an opposing surface of any kind when the two surfaces are joined. Superior electrical conductivity can be provided without any additional steps, for example, soldering or reflow of metallized bumps of other methodologies. In one application of the invention, for example, the attachment of a chip to a substrate, a chip mount to a substrate using a chip with co-deposited particles on its contact surfaces can be completed with a normal nonconductive adhesive to provide a stronger bond between the chip and the substrate, and eliminate the necessity of conductive adhesive underfill.

Figure 16:
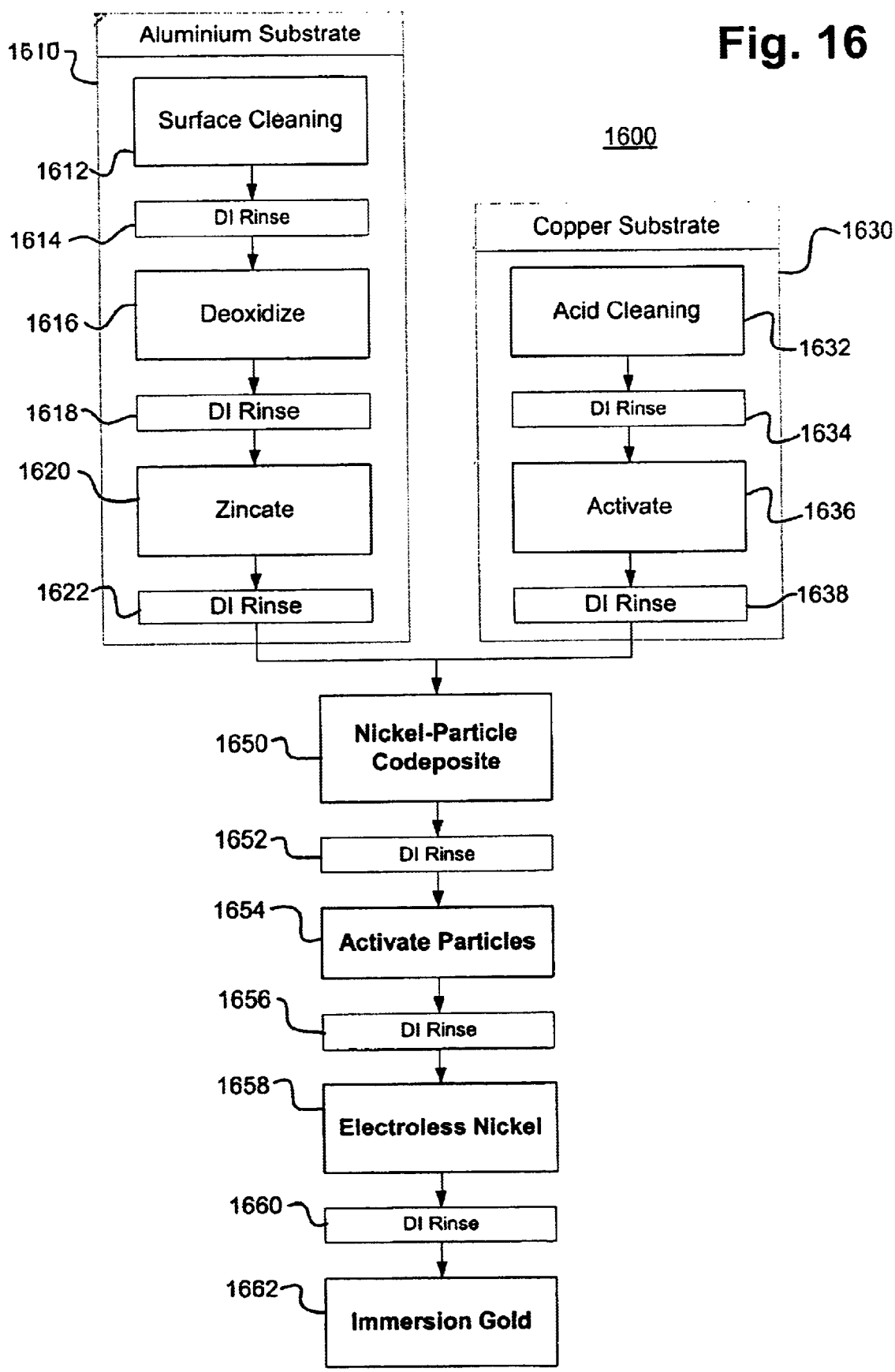
FIG. 16 is a schematic diagram detailing the steps for a preferred embodiment of the metal and particle co-deposition process of the present invention.

The schematic drawing shown in FIG. 16 illustrates the principles of a preferred embodiment of the invention. Conceptually, a comprehensive electroless co-deposition procedure 1600 consists of surface preparation of substrate pads, modified electroless nickel-particle co-deposition, a second electroless nickel-plating, and immersion gold treatment. While nickel is the preferred metal for use in the metal-particle co-deposition process, other metals, such as cobalt, copper, iron, gold, silver, zinc, palladium, platinum, rhodium, and ruthenium, may be used with the appropriate electroless catalytic processes.

It is well known that good plating starts with proper surface preparation of the contact surfaces. A proper preparation is one whereby surface contamination is removed, which leaves a clean, oxide-free surface. Depending on the type of the contact surface and contaminations, different pretreatments are needed. Typically, surface contaminants that must be removed before plating include one or more of the following: organic contaminants (e.g., oils and lubricants), buffing compounds, oxide films, dirt, and fluxes.

In an embodiment wherein an aluminum contact surface is to be enhanced 1610, the contact surface is first surface-cleaned 1612 by alkaline cleaning solution followed with a deionized water rinse 1614. The alkaline soak cleaning material may contain a mixture of alkaline sodium compounds such as hydroxides, carbonates, phosphates, and/or surfactants. The selection of cleaners can be adjusted according to the nature of the surface contamination. The alkaline cleaning can also include an organic chelating agent and/or sodium cyanide to accomplish surface cleaning and deoxidation simultaneously. However, a separate deoxidization process 1616 using acid deoxidizers may also be used in this embodiment. It is believed that acid pickling using combined nitric acid (preferably 50% by volume) and ammonium bifluoride solution helps and benefits the initiation and activation of the contact surfaces for electroless plating. Practically, such a conditioning is desired in this embodiment to remove alloying elements from the substrate surface and to prepare it for uniform zincating. This step may be performed by immersion in strong nitric-acid based solution. Reaction with nitric acid forms a thin, light, uniform oxide film, on the aluminum contact surface that protects it from further attack by the acid. A subsequent zincating process easily removes this film. For wafers that may contain a high percentage of silicon, hydrofluoric acid or fluorides may be added to the nitric acid to dissolve silicon.

Residues from cleaners and deoxidizers can increase the porosity of an electroless nickel plate by creating passive spots on the contact surfaces that will not initiate electroless plating. This in turn creates deposition problems for hard particles. Therefore, in this embodiment a deionized water rinse 1618 is a preferred step after deoxidizing, and good rinses are desirable throughout the process of this embodiment. After rinsing, the contact surfaces normally should be dried at an appropriate temperature, i.e., a drying temperature should be chosen according to the type of substrate housing the contact surfaces such that the temperature is not deleterious to the substrate.

Following deoxidization, zincating 1620, a process wherein an intermediate molecular zinc layer replaces the surface aluminum on the contact surface, is a common step to protect the deoxidized, active aluminum surface from reoxidation during any transfer and from potential direct reaction with an electroless nickel solution. The zinc layer further catalyzes the electroless nickel deposition. Proprietary zincate solution, for example, Fidelity 3116 (Fidelity Chemical, Newark, N.J.), is used for zincation in this embodiment. As an alternative embodiment, a double zincating procedure is also considered in the invention. In such a process, the initial zinc layer is removed by a dip in 50% nitric acid, and a second zinc layer is deposited by a short immersion in the zincate solution. The benefits of this treatment come from the use of a less critical first zincating step to deoxidize the contact surface and remove alloying inclusions, while the second zincating treatment can be adjusted to produce a thin, tight zinc deposit on the uniformly conditioned contact surface. However, such a double zincating process normally requires a thicker aluminum contact surface, typically greater than 1000 nanometers.

In another embodiment, a substrate with copper contact surfaces 1630 may be used. The surface treatment for electroless particle-enhancement of copper contact surfaces is different from that for aluminum. First the copper contact surfaces are cleaned by using acidic solutions 1632. An ATO Tech AFR2 (Berlin, Germany) system may be used for surface cleaning, followed by thorough rinsing with deionized water 1634. Copper is a metal that will not catalytically initiate hypophosphite electroless nickel solution, which represents the chemistry of another Fidelity propriety system (Fidelity 9002) that may be used in the electroless nickel solution of the described embodiments. To render copper catalytic, one of the commercially available approaches is to activate each contact surface 236 as a catalyst by immersion in dilute palladium chloride solutions. In this embodiment, Fidelity 9025 propriety solution may be used, but any applicable chemical systems can be utilized without significant effects on the other steps in the process. The catalyzed copper is again rinsed in deionized water 1638.

Electroless nickel-particle co-deposition is the focus of the invention. Micron-sized hard particles are plated on the contact surfaces by electroless nickel-particle co-deposition 1650. Particles are introduced to an electroless nickel solution, in one embodiment, Fidelity 9002 proprietary solution, at a desired particle concentration. The concentration is somewhat dependent on what particle population density is expected on the deposited surface, but typically is on the level of 1 g/L. Preferably, the electroless co-deposition method plates a single-layer of sparsely, yet uniformly dispersed, narrow-banded (i.e., the distribution of or variation between particle size or diameter is very small), hard particles on the contact surfaces of the substrate. For best surface joining, the resulting metal layer on the areas of the contact surfaces not covered by particles after co-deposition ideally should be flat with no surface concavity. This preferred single layer and fairly uniformly dispersed particle deposition design offers both the shortest electrical pathway via excellent conductive nickel and gold overcoats on the hard particles, and the best thermal conductive media because of the excellent thermal conductivity coefficient of the hard particles, for example diamond particles.

Preparation of the particles co-deposited on the contact surfaces is desirable before the second electroless nickelplating step. After a deionized water rinse 1652 following the co-deposition process step, activation of the surfaces of the particles 1654, for example through the use of a catalyst, is preferred to achieve a consistent and comprehensive nickel coat over the particles during the second nickel plating treatment. Poor activation at this stage can cause lack of adhesion of nickel to the deposited diamond particles and porous nickel deposition with poor conductivity. One solution that can be used for the particle activation is the Fidelity 9025 solution, also used to catalyze a copper contact surface as described above. After activation, the plated contact surfaces are rinsed in deionized water 1656.

The purpose of the second electroless nickel plating step 1658 is to cast a thin nickel layer to the co-deposited nickel-particle surface. The second nickel plating solution, in one embodiment, Fidelity 9002 proprietary solution, is not charged with any type of particles. The nickel cast provides a conductive metal overcoat on the deposited nonconductive particles. Good nickel coverage provides a good gold layer by the following immersion gold process, and therefore better overall electrical conductivity for the joining surfaces. The chemical system used in this step may be the same as that used in the first electroless nickel solution except for the particles. The substrate with the nickel-particle plate is again rinsed in deionized water 1660 after the second nickel plating treatment.

Immersion gold is a typical finishing step 1662. The process differs from the autocatalytic nickel plating in both its mechanisms and its results. An immersion gold process actually replaces nickel molecules on the surface of the second nickel plate for gold molecules, resulting in a thin gold layer. Oromerse MN (Technic, Inc., Cranston, R.I.) proprietary solution may be used. While the second nickel plating provides a conductive pathway and the robust mechanical bonding strength to secure the particles to the substrate, a finish layer of dense immersion gold ensures persistent protection from surface degradation and excellent electric conductivity over a long period of time.

The major benefit of using an electroless particle co-deposition process to attach hard particles to chip bond pads is that particle attachment can occur at the wafer level. This means that all the bonds pads of all the hundreds of chips on a wafer can be "bumped" with hard particles before the wafer is diced. There is no need for electrical isolation between any of the chips or the respective bond pads because the process is electroless. The deposition only occurs on the individual bond pads. The process is very efficient as well because only thin layers of metal are plated; the "bump" is created by the particles trapped in the metal. This is in contrast to the significant amount of time it takes to build up a metal bump by a standard electroless metal deposition process.

Experimental Observations

1. General

Extensive experiments verifying the feasibility of the present method for component attachment have been conducted at NanoPierce Technologies in Colorado Springs, Colo. and NanoPierce Card Technologies, GmbH in Munich, Germany. The experiments covering the validation for the entire process can be categorized into three groups, namely: a) particle placement on wafer, substrates, or antenna structure; a) bonding tests using various non-conductive adhesives; and c) characteristics and reliability testing for bonded components using the methods disclosed in this invention.

2. Description of Materials and Process Used in Validation Test 2.1 Chip

For the development of a die bonding process for a smart inlay application, a special test chip has been developed. This chip has the same dimensions and bond pad positions like the most common chip for smart inlay applications named "I-Code," which has been developed by Philips. This test chip is configured for only measurement purposes and contains two 4-point-Kelvin structures for contact resistance measurement and an additional daisy-chain structure for further qualification.

2.2 Substrate

The test substrates selected for the chip attachment test were similar to those commonly used in smart card and smart inlay applications. Both rigid board and flex circuit substrates were chosen. The test substrates include rigid board with copper tracks, rigid board with Ni/Au plated copper tracks, flex circuit with copper structures, and flex circuit with aluminum structures.

2.3 Adhesives

In order to achieve the greatest reliability, screen tests utilizing various adhesives on different substrates were performed. The following specific criteria for the selection of the adhesives was determined in order to search for an adhesive with highest bonding reliability and greatest electrical performance. The criteria include:

fast curing at a low temperature;

low moisture absorption;

relatively high shrinkage during curing;

a compatible thermal expansion coefficient with the chip and substrate; and enough hardness upon cure that movement between the chip and substrate is prevented;

The adhesives considered in the screen tests include cyanoacrylate adhesives, epoxy-based adhesives, UV light curing acrylate-based adhesives, and light activated epoxy-based adhesives.

3. Particle Placement Process

Two particle placement methods have been indicated in this invention, namely a modified electrolytic plating method and a modified electroless method. For the chips used in the test, the two-step electroless process as disclosed in U.S. patent application Ser. No. 09/883,012 entitled "Electroless Process for the Preparation of Particle-Enhanced Electric Contact Surfaces," filed Jun. 15, 2001 was used. The detailed procedure for the particle placement is as the following.

Figure 17:
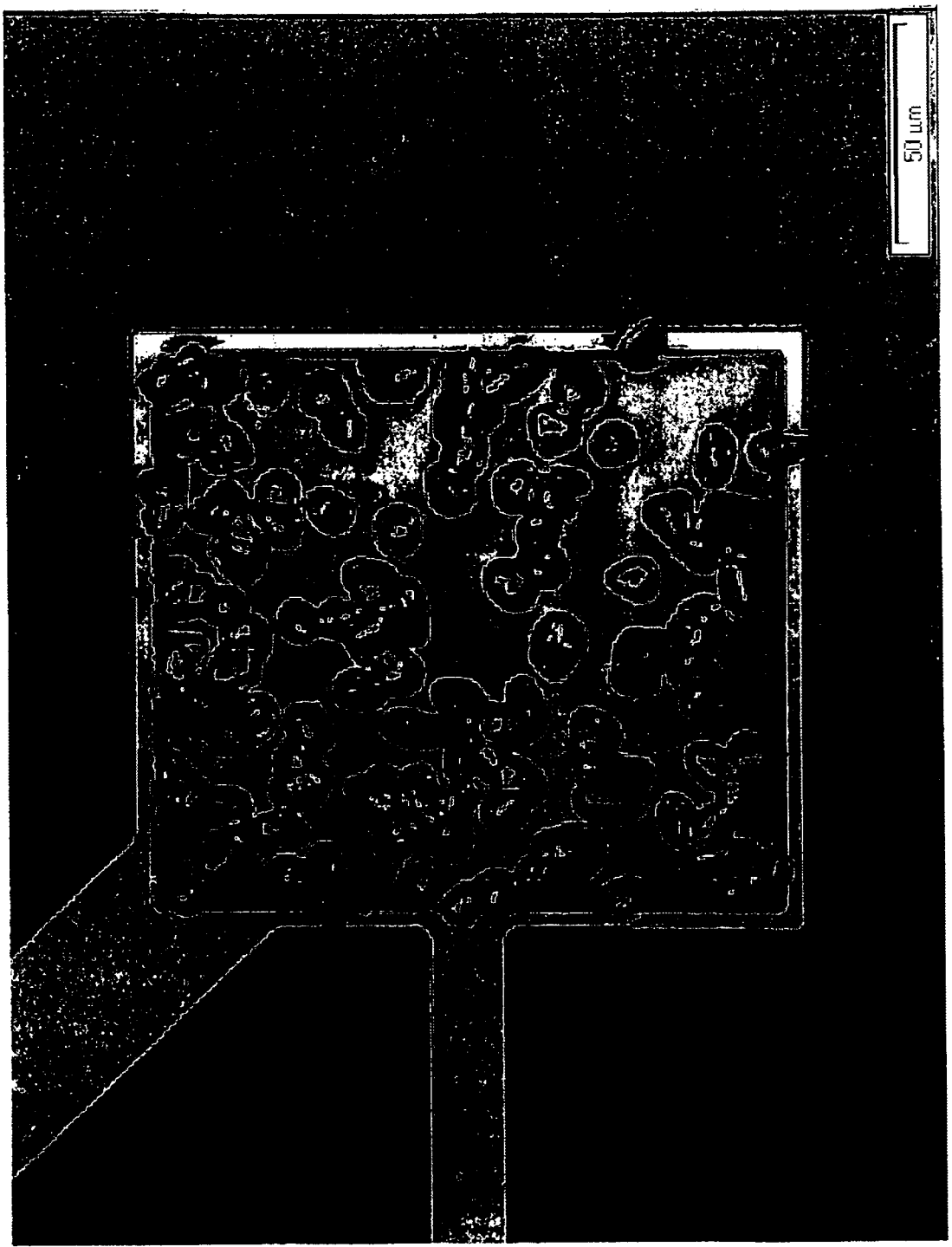
FIG. 17 is a microscopic photograph showing a top plan view of a diamond-nickel co-deposited surface on aluminum substrate with a gold finish coat deposited by the electroless process of the present invention.
Figure 18:
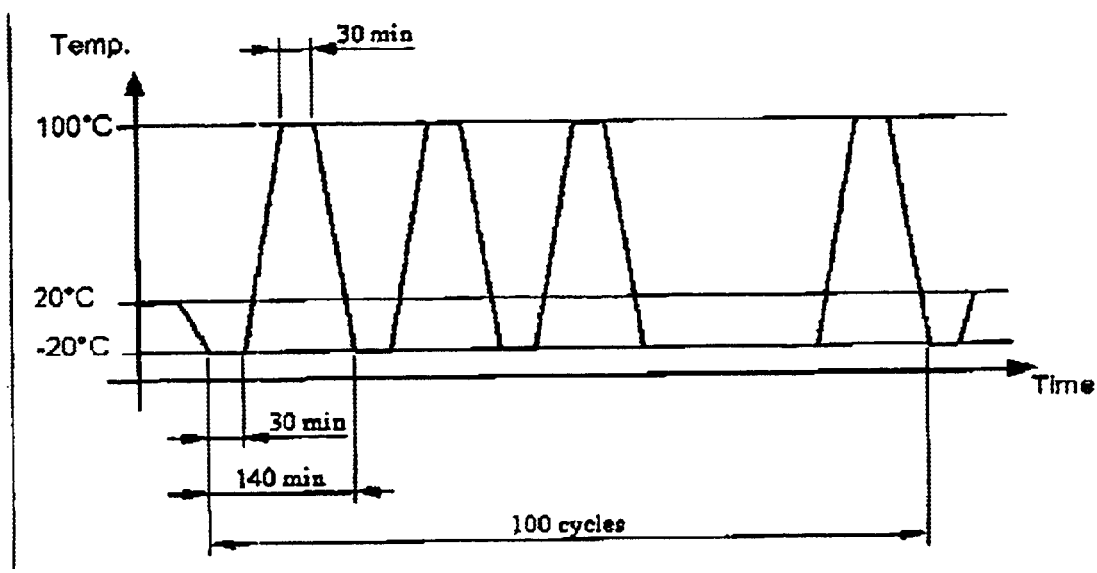
FIG. 18 is a graph illustrating of temperature cycling.

The wafer was cleaned by alkaline solution at 135° F. for 3 minutes, followed by etching in 50% nitric acid. The wafer was then zincated in a Fidelity 3116 (Fidelity Chemical, Newark, N.J.) solution for 20 seconds. The wafer was again etched in 50% nitric acid, followed by a second zication (often referring as double zication) in the Fidelity 3116 solution for another 10 seconds. After the double zication, the wafer was immersed into a Fidelity 9002 (Newark, N.J.) proprietary nickel solution for 3 minutes. The nickel-plating solution contained 6 to 12 micron sized diamond particles (GE Superabrasive, Worthington, Ohio) at a solid concentration of 0.5%. After the particles were plated on the wafer, the wafer was activated by a Fidelity 9025 (Newark, N.J.) proprietary palladium solution. Another layer of nickel was then plated by Fidelity 9002 (Newark, N.J.) proprietary nickel solution, followed by an immersion gold finish process. A representative particle-enhanced wafer bond pad is shown in FIG. 17.

4. Chip Bonding Process

Chips were bonded to the different substrate materials to determine the bonding force for the reliability test. The chip was taken manually out of the gel pack and placed face down onto a presentation substrate for the die bonder. From this presentation substrate the die bonder picks the chip with a programmable force and delay time. With a beam splitter optic, the chip was aligned to the substrate by hand. The adhesive was dispensed manually by a pin transfer. Then the chip was bonded to the target substrate with defined bond force and pressure time. The die bonder used in the test could heat the bond tool up to 300° C. For the final curing of the adhesive, the fully assembled test boards were placed in an oven for the required time at 150° C.

During the die bonding process a certain force had to be applied so that the particles on the particle-enhanced surface could penetrate into the conductor of the opposite contact site. By pressing the chip onto the rigid test substrate with different forces, the minimum bond force was determined when all of the 10 bond pads had a contact to the substrate. By adding an additional force for safety reasons the optimal bond force for the rigid test substrate was set at 250 grams. By calculating the bond force per bond pad, assuming that the relative contact force is uniform over all pads, the large pads have a bonding force of approximately 50 grams and the smaller pads of approximately 20 grams. This is relatively low in comparison to anisotropic adhesive bonding and to the stud bumping process, which for similar sized bond pads required bonding forces of about 100 grams for the large pads and 50 grams for the small pads.

At the flex substrate with the aluminum tracks the bond force could be lowered to 100 gram without a significant increase of the contact resistance. At a bonding force of 50 gram an increase of the contact resistance was visible. Further test are being performed on this effect.

For the tested adhesives the following bond parameters have been used:

| | Adhesive | | | | |
|---|---|---|---|---|---|
| Process | Threebond 2217H | Threebond 2271B | EPO-TEC 353 ND | Threebond 22X-330 | Threebond 3372C |
| Pick | 16 gr, 50 ms, 150° C. | 16 gr, 50 ms, 150° C. | 16 gr, 50 ms, 130° C. | 16 gr, 50 ms, 150° C. | 16 gr, 50 ms, 150° C. |
| Dispens | Manual pin transfer | Manual pin transfer | Manual pin transfer | Manual pin transfer | Manual pin transfer |
| Place | 250 gr, 10 s, 150° C. | 250 gr, 15 s, 150° C. | 270 gr, 15–20 s, 130° C. | 250 gr, 10 s, 150° C. | 250 gr, 10 s, 150° C. |
| Cure of adhesive | 150° C., 5 min in oven | 150° C., 2 h in oven | 150° C., 5 min in oven | 150° C., 10 min in oven | 150° C., 1 h in oven |

After curing the adhesive a shear test was executed at the half of the samples to determine the shear strength of each combination. The other half of the samples was stressed at temperature cycles and then a shear test executed. The tests brought the following results:

| Type of adhesive | Rigid board | Flex circuit |
| --- | --- | --- |
| Cyanoacrylate (3 types) | Didn't meet the requirements due to a large mismatch at the thermal expansion coefficient and a low operation temperature limit | Didn't meet the requirements due to a large mismatch at the thermal expansion coefficient and a low operation temperature limit |
| Epoxy based adhesive (4 types) cured by increased temperature | Good results at shear strength, but require a relative high curing temperature and long bonding and curing time | Good results at shear strength, but require a relative high curing temperature and long bonding and curing time |
| UV light curing acrylate based adhesive | Could not be cured on rigid board because UV light doesn't pass the substrate nor the chip | Relatively good bonding performance, but not fully cured at areas with the conductive tracks (shadow) |
| Light activated epoxy based adhesive | No curing because of chemical inhibition of the adhesive caused by rigid board | Excellent bonding performance and very fast curing |

5. Tests

All the samples were subject to optical inspection before being electrically tested. An Agilent 34420A nano-voltmeter was used to measure the contact resistance. Among the test samples, particle-enhanced chips were bonded to the two rigid substrates using three epoxy-based adhesives respectively. For comparison, additional dies with out particle-enhancement were also assembled to the rigid substrate with Ni/Au finish using either an anisotropic conducting adhesive, an isotropic conducting adhesive, or a solder bond. After measurement of the initial contact resistance, the samples were stressed by temperature cycling. The samples were measured again every 100 temperature cycles. The major parameters in the temperature cycles are shown in the graph below.

The measurement of the contact resistance brought the following results:

1) The particle-enhanced contacts could penetrate copper oxides easily.
2) The contact resistance between the chip and the rigid board with the copper tracks is lower than at the Ni/Au plated boards. The average resistance is approximately 10 mOhms for the copper track contacts and 20 mOhms for the Ni/Au finished boards.
3) The contact resistance remained constant over more than 400 temperature cycles, which indicates good reliability for the test sample made using the method disclosed in this invention. The test is still ongoing.
4) Although there were small differences between the contact resistances for the contacts made using various adhesives, the contacts made by non-conductive adhesive with particle-enhanced surfaces are on the same level with untreated surface boding by anisotropic adhesive and solder connections.
5) Isotropic conductive adhesive, as used in the comparative samples, is not usable at chips with bond pad pitches of 200 microns or less.

Conclusion

The method and products provided in accordance with the present invention have a number of advantages over the prior art. First, only a low bonding force is needed during and after the chip or chip module is bonded to a substrate or antenna structure, since the sharp, pointed, hard particles can easily penetrate the conductive contact surface. This low residual stress on the chip or chip module compared to the high stress incurred in conventional chip attachment methods, such as conductive adhesive bonding, allows thinner chips or chip modules to be used to make smaller, more flexible, mobile RFID devices, such as smart cards and smart inlay devices.

Second, to the cost of manufacturing the cards and labels is significantly reduced by the elimination of manufacturing steps and the use of less expensive materials. Because high temperatures are not employed in connecting components—as in soldering or wire bonding—a simple, inexpensive substrate material can be employed, for example, polyvinyl chloride, polyethyleneterephthalat ("PET/PETP"), glycol-modified PET ("PET-G"), acrylonitrile-butadiene-stryrene copolymer ("ABS"), polystyrol ("PS"), polyproplyne ("PP"), cellulose or paper and blends, laminates, or co-extruded combinations of these materials. These materials can also be printed easily. No special handling or curing steps are required.

Third, if the chip bond pads are particle-enhanced, it is possible to make a design arrangement so that the placement of the chip is not very critical. In contrast, when conductive adhesives are employed, the printing of the adhesive on the chip must be very precise, because the chips are small. With the present invention, simpler, less expensive manufacturing equipment that can be used and operated at higher speeds. In addition, manufacturing of the card or label is simplified in that non-conductive adhesives can be applied rather indiscriminately without concern for the viability of the electrical connection between the components being bonded. The advantage is more significant for small components and pitch distance attachments. When compared to isotropic conductive adhesive, the printing or dispensing of non-conductive adhesive is much simpler, as there is no danger of shorting pathways by spreading excess adhesive. This also greatly increases manufacturing line speed and reduces the cost of the necessary manufacturing equipment. Non-conductive adhesives are also less expensive. In addition, the electrical and thermal performance of smart cards and smart inlays is improved while maintaining reliability.

Fourth, if the particle-enhanced contact is formed on the chip carrier substrate or antenna structure, the chip requires no treatment. It can be simply bonded to the chip carrier substrate or antenna structure by non-conductive adhesive.

Fifth, if the particle-enhances contact is formed on the chip, hundreds or thousands chips in a wafer can be plated in one treatment. After dicing the chips can be readily used by simply bonding with non-conductive adhesive. Further, if an electroless plating process is used to make the particle-enhanced surface on a chip or wafer, no masking is required for plating because electroless process is selective.

Sixth, because the particle connections provide a very low resistance path between the chip and the antenna, and the non-conductive adhesives of the present invention set rapidly, the electrical connection between components can be tested immediately. Thus, manufacturing defects can be detected promptly, avoiding excessive waste and manufacturing losses because of delayed detection inherent in present manufacturing processes.

Seventh, the process for forming electrical connections using the present invention enables the use of different, less expensive antennae and coil materials. Current processes are not compatible, for example, with various forms of coil technology, such as aluminum coils, which oxidize rapidly (i.e., in a matter of minutes) and form a hard oxide layer which precludes electrical connection. These materials cannot be used with the slow forming bonds of currently employed adhesives. In contrast, the methods of the present invention penetrate the aluminum oxide or other insulatory films to form an electrical connection. Other materials that can be used to form antenna patterns capable of connection with a particle-enhanced contact include, for example, copper, aluminum, gold, and other metals, conductive inks, conductive pastes, metal foils, and graphite.

Eighth, if the bond pads of chips are particle-enhanced, for example, by enhancing all the chips on a wafer before it is diced, the chips can be stored in inventory and used with any module or antenna, regardless of the composition of the contact surfaces opposing the chip. For example, in a smart inlay the chips could be used with any antenna sheet regardless of whether the antenna is formed of a conductive paste or ink, or whether the metal foil is aluminum, copper, or any other metal.

Although various embodiments of this invention have been described above with a certain degree of particularity, or with reference to one or more individual embodiments, those skilled in the art could make numerous alterations to the disclosed embodiments without departing from the spirit or scope of this invention. It is intended that all matter contained in the above description and shown in the accompanying drawings shall be interpreted as illustrative only of particular embodiments and not limiting. Changes in detail or structure may be made without departing from the basic elements of the invention as defined in the following claims.

What is claimed is:

1. An RFID device comprising:
    a first electrical component having
        a first electrically conductive contact;
    a second electrical component having
        a second electrically conductive contact;
            wherein the first and second electrically conductive contacts are in alignment with one another
    at least one electrically conductive hard particle attached without an adhesive to at least one of the first and second electrically conductive contacts,
        wherein the at least one electrically conductive hard particle has a hardness at least as great as that of at least one of the first and second electrically conductive contacts;
    a non-conductive adhesive disposed between the first and second electrically conductive contacts;
        wherein the first and second electrically conductive contacts are held together by the non-conductive adhesive once the adhesive cures;
    wherein a permanent electrical connection is formed between the first and second electrically conductive contacts; and
    wherein a permanent physical attachment is formed between the first electrical component and the second electrical component.

2. The RFID device of claim 1, wherein the at least one electrically conductive hard particle pierces a surface of at least one of the first and second electrically conductive contacts.

3. The RFID device of claim 1, wherein the nonconductive adhesive is further disposed between the first electric component to the second electrical component.

4. The RFID device of claim 1, further comprising an electrically conductive metal layer deposited on the at least one electrically conductive hard particle.

5. The RFID device of claim 1, wherein the first component is a chip and the second component is a chip carrier, and
    wherein the at least one electrically conductive hard particle is attached to a bond pad on the chip.

6. The RFID device of claim 1, wherein the first component is a chip and the second component is a chip carrier, and
    wherein the at least one electrically conductive hard particle is attached to a contact land on the chip carrier.

7. The RFID device of claim 1, wherein the first component is a module and the second component is an electrically conductive area, and
    wherein the at least one electrically conductive hard particle is attached to a contact land on the module.

8. The RFID device of claim 1, wherein the first component is a module and the second component is an electrically conductive area, and
    wherein the at least one electrically conductive hard particle is attached to a contact area on the electrically conductive area.

9. The RFID device of claim 1, wherein the first component is a chip and the second component is an electrically conductive area, and
    wherein the at least one electrically conductive hard particle is attached to a bond pad on the chip.

10. The RFID device of claim 1, wherein the first component is a chip and the second component is an electrically conductive area, and
    wherein the at least one electrically conductive hard particle is attached to a contact area on the electrically conductive area.

11. The RFID device of claim 7, 8, 9 or 10, wherein the electrically conductive area comprises a conductive path.

12. The RFID device of claim 7, 8, 9 or 10, wherein the electrically conductive area comprises an antenna.

13. The RFID device of claims 7, 8, 9 or 10, wherein the electrically conductive area comprises a conductive material comprising at least one of the following: copper, aluminum, gold, metal foils, conductive inks, conductive pastes, and graphite.

14. The RFID device of claim 1, wherein the at least one electrically conductive hard particle is a metal particle comprising at least one of the following: copper, aluminum, nickel, tin, bismuth, silver, gold, platinum, palladium, lithium, beryllium, boron, sodium, magnesium, potassium, calcium, gallium, germanium, rubidium, strontium, indium, antimony, cesium, and barium, and alloys and intermetallics of these metals.

15. The RFID device of claim 1, wherein the at least one electrically conductive hard particle comprises a non-electrically-conductive particle core surrounded by a metal layer, and wherein the non-electrically-conductive particle core comprises at least one of the following: diamond, garnet, ceramic, oxides, silicides, silicates, carbides, carbonates, borides, boron fibers, and nitrides.

16. The RFID device of claim 1 or 15, wherein the at least one electrically conductive hard particle is attached to at least one of the first and second electrically conductive contacts by a metal plated layer deposited by an electrolytic metal-particle co-deposition process.

17. The RFID device of claim 1 or 15, wherein the at least one electrically conductive hard particle is attached to at least one of the first and second electrically conductive contacts by a metal plated layer deposited by an electroless metal-particle co-deposition process.

18. The RFID device of claim 15, wherein the metal layer comprises a nickel layer and wherein the non-electrically conductive particle core comprises diamond.

19. The RFID device of claim 15, wherein the metal layer comprises at least one of the following: copper, aluminum, nickel, tin, bismuth, silver, gold, platinum, palladium, lithium, beryllium, boron, sodium, magnesium, potassium, calcium, gallium, germanium, rubidium, strontium, indium, antimony, cesium, and barium, and alloys and intermetallics of these metals.

20. The RFID device of claim 1, wherein the at least one electrically conductive hard particle comprises a plurality of electrically conductive hard particles.

21. The RFID device of claim 1, wherein the RFID device comprises a smart card.

22. The RFID device of claim 1, wherein the RFID device comprises a smart inlay.

23. The RFID device of claim 22, wherein the smart inlay comprises a component of at least one of a smart label and a smart paper.

24. An electrical component for use in an RFID device, the electrical component for physically and electrically connecting to an additional electrical component in the RFID device, the additional electrical component having a second electrically conductive contact that forms an electrical connection with the first electrically conductive contact, the electrical component comprising:

a component base, the component base further comprising
a first electrically conductive contact for forming an electrical connection with a second electrically conductive contact on the additional electrical component; and
at least one electrically conductive hard particle attached without an adhesive to the first electrically conductive contact,
wherein the at least one electrically conductive hard particle has a hardness at least as great as that of the second electrically conductive contact.

25. The electrical component of claim 24, wherein the electrical component is one of a plurality of particle-enhanced electrical components separated from an array comprising the plurality of particle-enhanced electrical components.

26. The electrical component of claim 25, wherein each of the plurality of particle-enhanced electrical components is identical.

27. The electrical component of claim 25, wherein the array comprises at least one of a semiconductor wafer, a flexible circuit tape, a sheet comprising a plurality of chip carriers, a sheet comprising a plurality of chip modules, and a sheet comprising a plurality of antenna on a substrate.

28. The electrical component of claim 24, wherein the electrical component comprises at least one of the following: a chip, a chip carrier, a chip module, and a conductive area.

29. The electrical component of claim 28, the chip further comprises at least one of the following: a discrete circuit device, an integrated circuit device, a memory device, a microprocessor device, a transceiver device, and an electro-optic device.

30. The electrical component of claim 28, wherein the electrically conductive area comprises a conductive path.

31. The electrical component of claim 28 or 30, wherein the electrically conductive area comprises an antenna.

32. The electrical component of claim 28, wherein the electrically conductive area comprises a conductive material comprising at least one of the following: copper, aluminum, gold, metal foils, conductive inks, conductive pastes, and graphite.

33. The electrical component of claim 24, wherein the at least one electrically conductive hard particle is a metal particle comprising at least one of the following: copper, aluminum, nickel, tin, bismuth, silver, gold, platinum, palladium, lithium, beryllium, boron, sodium, magnesium, potassium, calcium, gallium, germanium, rubidium, strontium, indium, antimony, cesium, and barium, and alloys and intermetallics of these metals.

34. The electrical component of claim 24, wherein the at least one electrically conductive hard particle comprises a non-electrically-conductive particle core surrounded by a metal layer.

35. The electrical component of claim 34 wherein the non-electrically-conductive particle core comprises at least one of the following: diamond, garnet, ceramic, oxides, silicides, silicates, carbides, carbonates, borides, boron fibers, and nitrides.

36. The electrical component of claim 24 or 34, wherein the at least one electrically conductive hard particle is attached to the first electrically conductive contact by a metal plated layer deposited by an electrolytic metal-particle co-deposition process.

37. The electrical of claim 24 or 34, wherein the at least one electrically conductive hard particle is attached to the first electrically conductive contact by a metal plated layer deposited by an electroless metal-particle co-deposition process.

38. The electrical component of claim 34, wherein the metal layer comprises a nickel layer and wherein the non-electrically conductive particle core comprises diamond.

39. The electrical component of claim 34, wherein the metal layer comprises at least one of the following: copper, aluminum, nickel, tin, bismuth, silver, gold, platinum, palladium, lithium, beryllium, boron, sodium, magnesium, potassium, calcium, gallium, germanium, rubidium, strontium, indium, antimony, cesium, and barium, and alloys and intermetallics of these metals.

40. The electrical component of claim 24, wherein the at least one electrically conductive hard particle comprises a plurality of electrically conductive hard particles.

41. The electrical component of claim 24, wherein the RFID device comprises a smart card.

42. The electrical component of claim 24, wherein the RFID device comprises a smart inlay.

43. The electrical component of claim 42, wherein the smart inlay comprises a component of at least one of a smart label and a smart paper.

44. An RFID device comprising:

a first electrical component having
 a first electrically conductive contact;
a second electrical component having
 a second electrically conductive contact;
  wherein the first and second electrically conductive contacts are in alignment with one another
at least one electrically conductive hard particle attached to at least one of the first and second electrically conductive contacts,
 wherein the at least one electrically conductive hard particle has a hardness at least as great as that of at least one of the first and second electrically conductive contacts, and
 wherein the at least one electrically conductive hard particle pierces a surface of at least one of the first and second electrically conductive contacts;
a non-conductive adhesive disposed between the first and second electrically conductive contacts;
wherein the first and second electrically conductive contacts are held together by the non-conductive adhesive once the adhesive cures;
wherein a permanent electrical connection is formed between the first and second electrically conductive contacts; and
wherein a permanent physical attachment is formed between the first electrical component and the second electrical component.

45. An electrical component for use in an RFID device, the electrical component for physically and electrically connecting to an additional electrical component in the RFID device, the additional electrical component having a second electrically conductive contact that forms an electrical connection with the first electrically conductive contact, the electrical component comprising:

a component base, the component base further comprising
 a first electrically conductive contact for forming an electrical connection with a second electrically conductive contact on the additional electrical component; and
at least one electrically conductive hard particle attached to the first electrically conductive contact,
 wherein the at least one electrically conductive hard particle has a hardness at least as great as that of the second electrically conductive contact, and
 wherein the at least one electrically conductive hard particle pierces a surface of at least one of the second electrically conductive contact.

* * * * *